(12) United States Patent
Haller

(10) Patent No.: US 7,199,419 B2
(45) Date of Patent: Apr. 3, 2007

(54) MEMORY STRUCTURE FOR REDUCED FLOATING BODY EFFECT

(75) Inventor: Gordon A. Haller, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 78 days.

(21) Appl. No.: 11/010,752

(22) Filed: Dec. 13, 2004

(65) Prior Publication Data

US 2006/0125044 A1 Jun. 15, 2006

(51) Int. Cl.
*H01L 27/108* (2006.01)

(52) U.S. Cl. ............... 257/306; 257/330; 257/308; 257/296; 257/E27.086; 257/E21.648

(58) Field of Classification Search ........... 257/330, 257/308, 296, 306
See application file for complete search history.

(56) References Cited

U.S. PATENT DOCUMENTS

| | | | |
|---|---|---|---|
| 4,903,344 A | | 2/1990 | Inoue |
| 6,172,391 B1 * | | 1/2001 | Goebel et al. ............ 257/305 |
| 6,320,222 B1 | | 11/2001 | Forbes et al. |
| 6,531,727 B2 | | 3/2003 | Forbes et al. |
| 6,964,895 B2 * | | 11/2005 | Hsu ............................ 438/238 |
| 2002/0030214 A1 * | | 3/2002 | Horiguchi .................. 257/301 |
| 2003/0001290 A1 * | | 1/2003 | Nitayama et al. ............. 257/907 |

OTHER PUBLICATIONS

Cho et al., "A novel pillar DRAM cell for 4Gbit and beyond," *IEEE*, 1998, pp. 38-39.

Denton et al., "Fully depleted dual-gated thin-film SOI P-MOSFET's fabricated in SOI islands with an isolated buried polysilicon backgate," *IEEE Electron Device Letters*, Nov. 1996, pp. 509-511, vol. 17, No. 11.

Doyle et al., "High performance fully-depleted *tri-gate* CMOS transistors," *IEEE Electron Device Letters*, Apr. 2003, pp. 263-265, vol. 24, No. 4.

Endoh et al., "$2.4F^2$ memory cell technology with stacked-surrounding gate transistor (S-SGT) DRAM," *IEEE Transactions On Electron Devices*, Aug. 2001, pp. 1599-1603, vol. 48, No. 8.

Endoh et al., "Novel ultrahigh-density flash memory with a stacked-surrounding gate transistor (S-SGT) structured cell," *IEEE Transactions on Electron Devices*, Apr. 2003, pp. 945-951, Vol. 50, No. 4.

Forbes, "DRAM array with surrounding gate access transistors and capacitors over global bit lines," surroundingdisc4.doc, Sep. 14, 2004.

Goebel et al., "Fully depleted surrounding gate transistor (SGT) for 70 nm DRAM and beyond," *IEEE*, 2002, 4 pages.

(Continued)

*Primary Examiner*—Jerome Jackson
*Assistant Examiner*—Paul Budd
(74) *Attorney, Agent, or Firm*—Knobbe Martens Olson & Bear LLP

(57) ABSTRACT

Methods of reducing the floating body effect in vertical transistors are disclosed. The floating body effect occurs when an active region in a pillar is cut off from the substrate by a depletion region and the accompanying electrostatic potential created. In a preferred embodiment, a word line is recessed into the substrate to tie the upper active region to the substrate. The resulting memory cells are preferably used in dynamic random access memory (DRAM) devices.

24 Claims, 19 Drawing Sheets

OTHER PUBLICATIONS

Huang et al., "Sub-50 nm P-channel finFET," *IEEE Transactions on Electron Devices*, May 2001, pp. 880-886, vol. 48, No. 5.

Kedzierski et al., "High-performance symmetric-gate and CMOS-compatible $V_t$ asymmetric-gate FinFET devices," *IEEE*, 2001, 4 pages.

Miyano et al., Numerical analysis of a cylindrical thin-pillar transistor (CYNTHIA), *IEEE Transactions on Electron Devices*, Aug. 1992, pp. 1876-1881, vol. 39, No. 8.

Nitayama et al., "Multi-pillar surrounding gate transistor (M-SGT) for compact and high-speed circuits," *IEEE Transacions on Electron Devices*, Mar. 1991, pp. 579-583, vol. 18, No. 3.

Sunouchi et al., "A surrounding gate transistor (SGT) cell for 64/256 Mbit DRAMs," *IEEE*, 1989, pp. 2.1.1-2.1.4.

Takato et al., "High performance CMOS surrounding gate transistor (SGT) for ultra high density LSIs," *IEEE*, 1988, 4 pages.

Terauchi et al., "A surrounding gate transistor (SGT) gain cell for ultra high density DRAMS," pp. 21-22.

Wong et al., "Self-aligned (top and bottom) double-gate MOSFET with a 25 nm thick silicon channel," IBM T.J. Watson Research Center, 4 pages.

\* cited by examiner

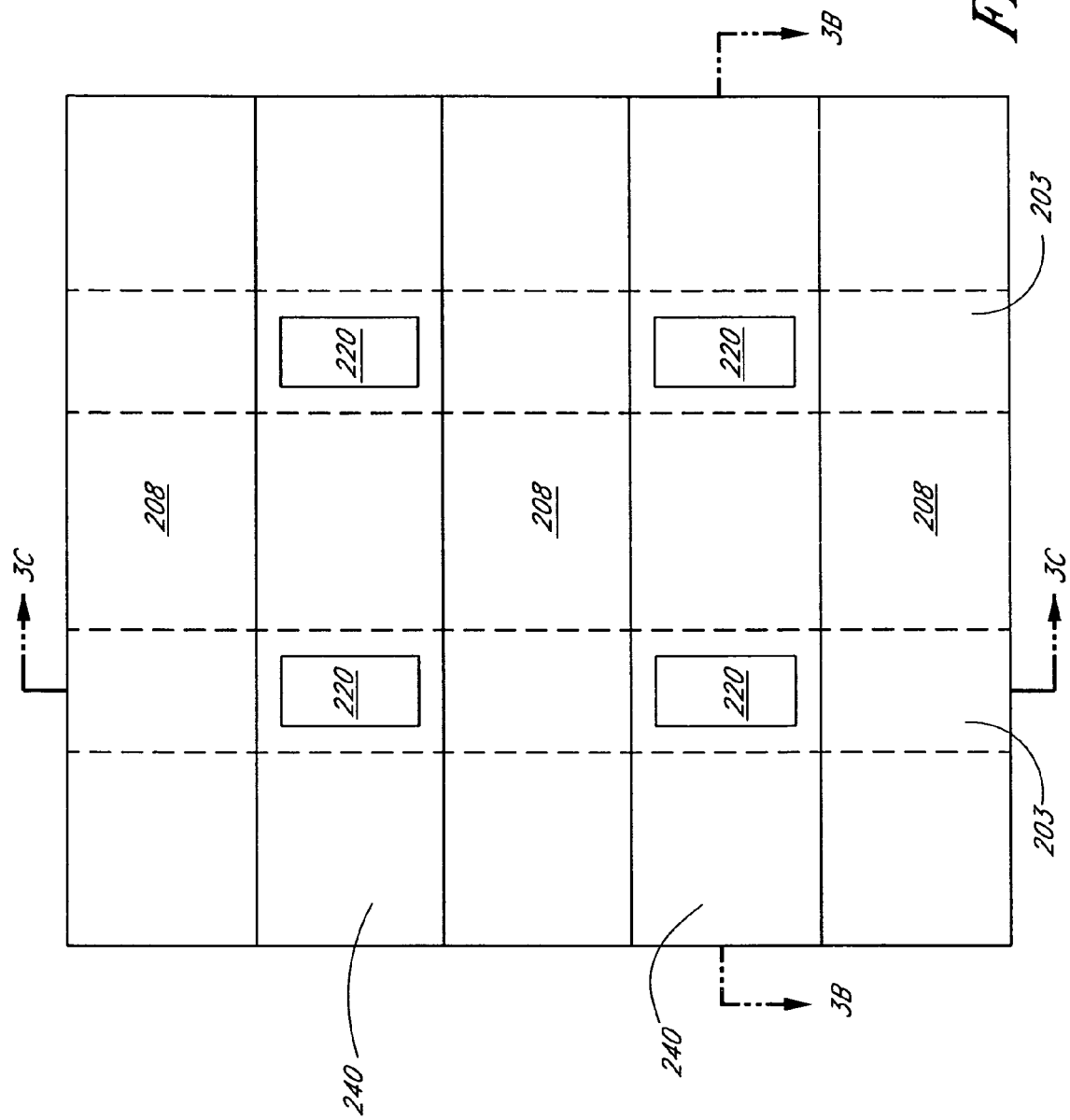

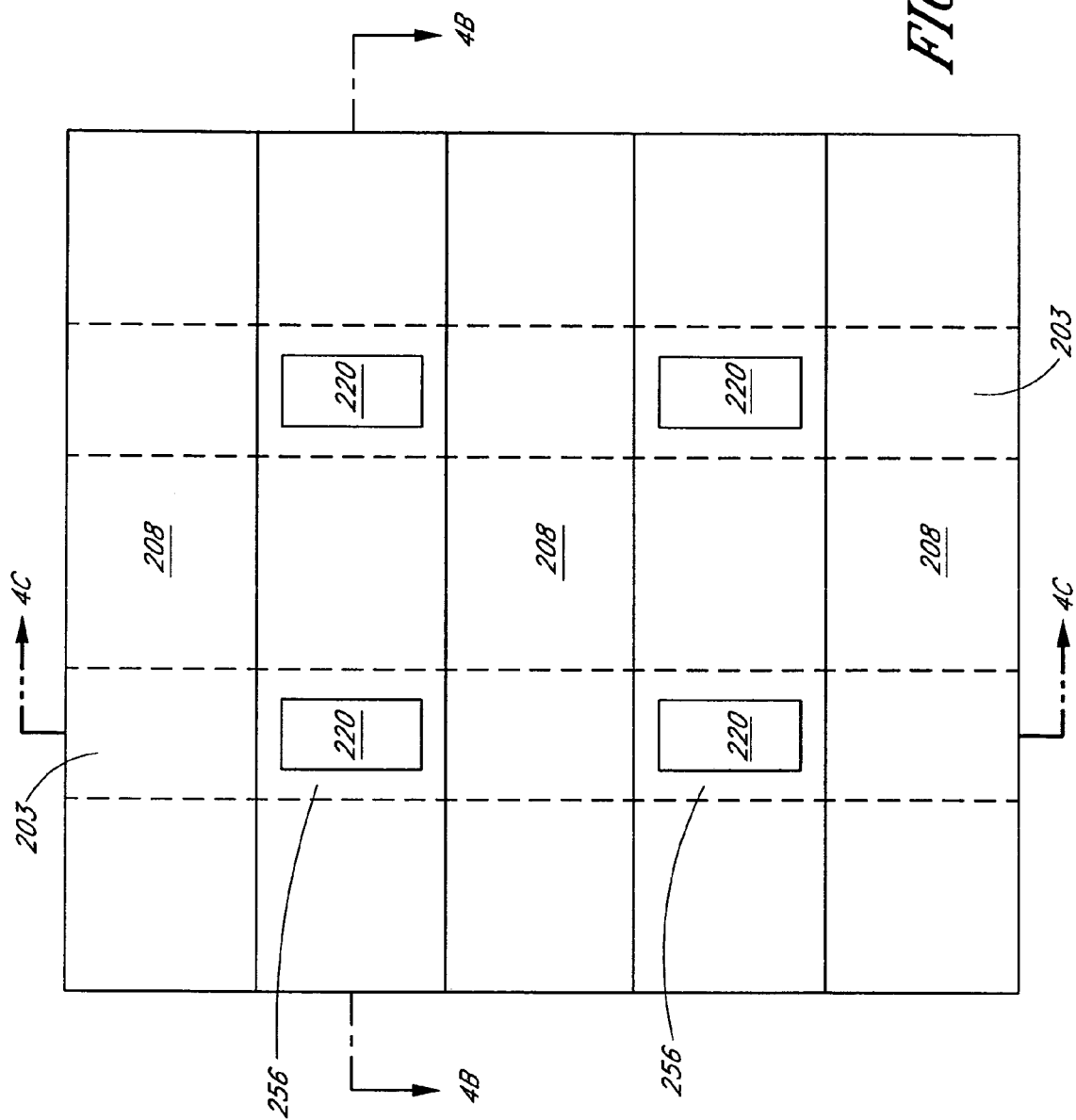

MEMORY STRUCTURE FOR REDUCED FLOATING BODY EFFECT

BACKGROUND OF THE INVENTION

1. Field of the Invention

The present invention relates to the field of integrated circuit fabrication, specifically to the formation of transistors.

2. Description of the Related Art

Since the introduction of the digital computer, electronic storage devices have been a vital resource for the retention of data. Conventional semiconductor electronic storage devices, such as Dynamic Random Access Memory (DRAM), typically incorporate capacitor and transistor structures in which the capacitors temporarily store data based on the charged state of the capacitor structure. In general, this type of semiconductor Random Access Memory (RAM) often requires densely packed capacitor structures that are easily accessible for electrical interconnection.

In order to increase efficiency of memory devices, there is an effort to create smaller memory cells. DRAM memory cells can shrink by decreasing the minimum feature size (F) through new and advanced lithography and etching techniques. Memory cells can also be decreased by designing a memory cell that requires less chip real estate in terms of minimum feature size. For example, many DRAM devices on the market today have a memory cell size of $8F^2$ or greater. However, DRAM devices can be made even smaller, such as $6F^2$ or $4F^2$. An example of a $6F^2$ device is disclosed in U.S. Pat. No. 6,734,482, issued to Tran, et al, the disclosure of which is incorporated herein by reference.

One method of designing smaller memory cells is to use vertical transistors, particularly vertical surrounding gate transistors (VSGT). VSGTs are typically metal-oxide-semiconductor field effect transistors (MOSFET) and can be designed in several different manners. In many embodiments of VSGTs, an upper active region of the device can be electrically separated from substrate by the lower source/drain region and/or by a dielectric layer. Such an electrically separated active region is known as a "floating body." The floating body can charge up and cause a transient bipolar current. This current can cause memory failures through cell capacitor discharge. Without being limited by theory, one explanation is that a transient hole current is caused by carriers generated during the high state. It is therefore desirable to minimize the floating body effect for small memory cells.

SUMMARY OF THE INVENTION

In an aspect of the invention, a method of reducing the floating body effect in a memory cell is disclosed. The method comprises forming an isolation trench within a substrate. A ridge is also defined in the substrate proximate to the isolation trench. The isolation trench is filled with an insulating material. A silicon pillar with an upper active area is formed over the ridge after filling the isolation trench. A source region is formed on the ridge adjacent to the silicon pillar. The insulating material in the isolation trench is recessed below a top point of the ridge in the substrate. A word line is deposited after recessing the insulating material, wherein the word line extends lower than the top point of the ridge. The method further comprises forming a capacitor over the silicon pillar after depositing the word line.

In another aspect of the invention, a memory array for a DRAM is disclosed. The array comprises a plurality of source regions on a plurality of substrate ridges. A plurality of isolation trenches are positioned between substrate ridges. A plurality of silicon pillars are positioned in rows on the substrate ridges between source regions. A plurality of word lines each surround one row of silicon pillars, wherein the word lines are substantially recessed to a depth below a top point of the substrate ridges. A plurality of digit lines are positioned above the silicon pillars and a cell capacitor overlies each silicon pillar.

A memory cell is disclosed in another aspect of the invention. The memory cell comprises a vertical transistor including a source region within a ridge of semiconductor material, an upper active area on a silicon pillar extending above the ridge, and a gate surrounding the silicon pillar. The gate is recessed into a trench next to the ridge. A cell capacitor contact plug is directly over the silicon pillar. The cell further comprises a cell capacitor including a lower electrode over and electrically connected to the cell capacitor contact plug, a capacitor dielectric over the lower electrode, and an upper electrode over the capacitor dielectric.

In another aspect of the invention, a method of forming a memory array is disclosed. The method comprises defining a plurality of parallel trenches and ridges in a p-doped bulk silicon substrate. The trenches are filled with an isolation material. A mask is formed over the substrate to create windows on the ridges in which to form pillars. A plurality of pillars is created over the ridges after forming the mask. The isolation material is recessed in the trench after forming the pillars. A plurality of word lines are deposited over the isolation oxide and the ridges and surrounding a row of pillars after forming the pillars. The word lines descend substantially into the trenches on two sides of each pillar.

BRIEF DESCRIPTION OF THE DRAWINGS

FIG. 3A is a schematic plan view of a memory array after formation of word lines for the array.

FIG. 4A is a schematic plan view of a memory array after planarization of vertical transistors of the array.

DETAILED DESCRIPTION OF THE PREFERRED EMBODIMENT

Figure 1A:
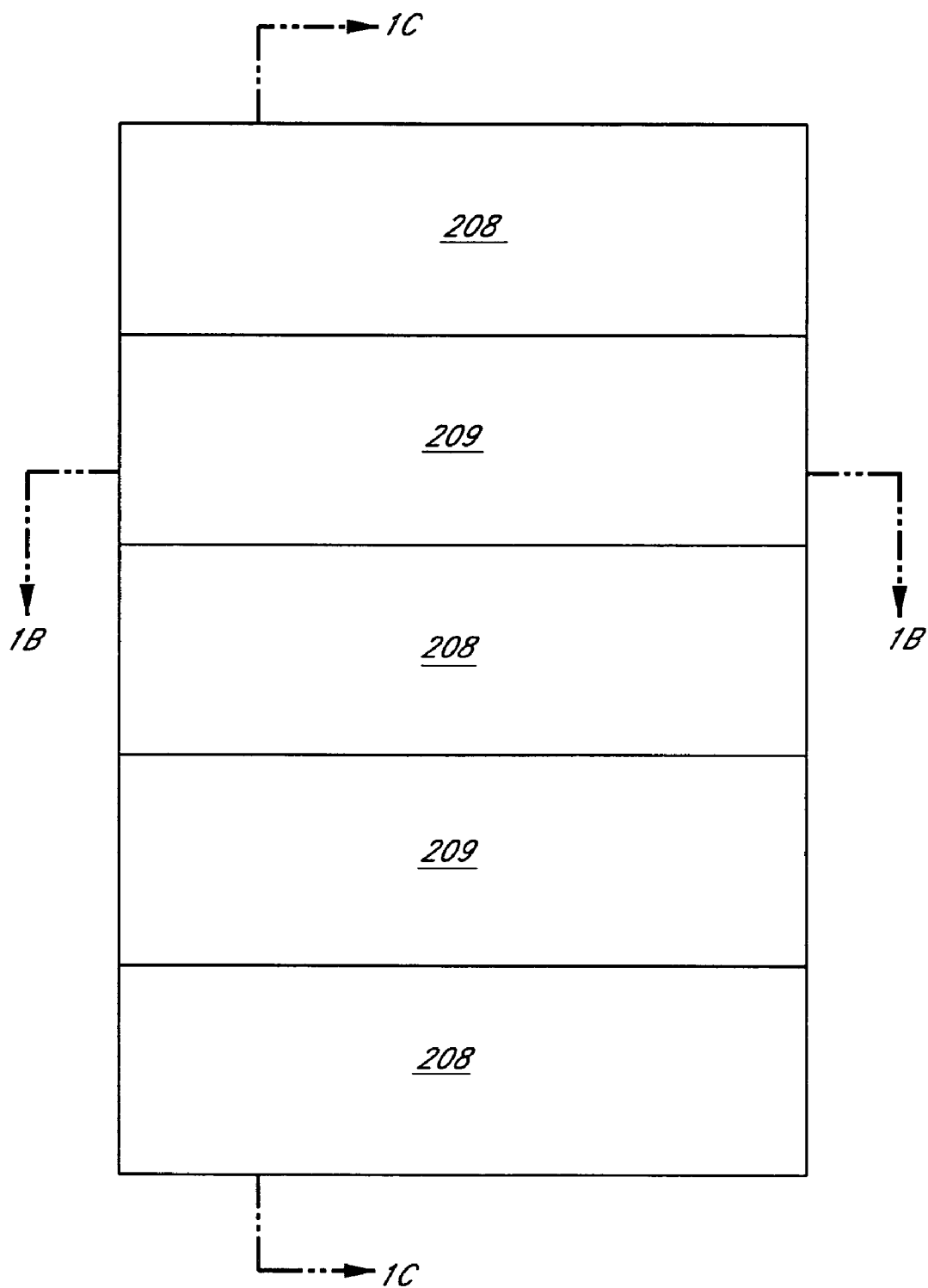
FIG. 1A is a schematic plan view of a memory array at a first stage of processing.

In the context of this document, the term "semiconductor substrate" is defined to mean any construction comprising semiconductor materials, including, but not limited to, bulk semiconductor materials such as a semiconductor wafer (either alone or in assemblies comprising other materials thereon), and semiconductor material layers (either alone or in assemblies comprising other materials). The term "substrate" refers to any supporting substrate, including, but not limited to, the semiconductor substrates described above. Also in the context of this document, the term "layer" encompasses both the singular and the plural unless otherwise indicated.

In small (e.g. $4F^2$) memory cell designs, a vertical transistor can be used. These transistors typically use silicon pillars to form at least a portion of the active region. Silicon pillars can be formed using multiple masks and providing a spacer lining sidewalls of small windows before selectively growing epitaxial silicon within the windows. A transistor formed using such a selective epitaxial growth (SEG) process is described in U.S. Pat. No. 6,756,625, issued to Brown (hereinafter Brown), the disclosure of which is hereby incorporated by reference. The Brown patent discloses a memory cell with a digit line beneath the silicon pillar.

The memory cell in that patent has several benefits. First, the size of the memory cell is 2F×2F, or $4F^2$, meaning that each side of the memory cell measures only two times the minimum feature size (F) that can be provided for using the lithography processes for the process node. Additionally, the Brown process used to form the epitaxial posts provides a consistent and efficient method of forming epitaxial silicon posts to be used for vertical transistors.

However, the floating body effect, which can cause a cell capacitor to discharge and cause memory faults, commonly exists in memory cells that use vertical transistors. As described above, the floating body effect occurs when an active region on the pillar, typically the drain, becomes isolated from the substrate. However, the skilled artisan will understand that the source could also be positioned at the top of the transistor pillar. The drain can be isolated by a dielectric layer or by the depletion region of a lower active area. When this occurs, the upper active area can charge up and cause the cell capacitor to discharge when it is supposed to remain in a charged state (i.e., when the transistor is ostensibly "off"). Ultimately, this will cause memory faults in the array.

One method of reducing the floating body effect involves the use of a gate extending below an area that might cut off the active region on the top of the pillar from the substrate. An example of this is extending the gate below a depletion region to tie the upper active area to the substrate. In an article by B. Goebel, et al., presented at the 2002 International Electron Devices Meeting (IEDM) and printed in the 2002 International Electron Devices Meeting Technical Digest, pp. 275–278, the idea of such a gate was proposed. That article is hereby incorporated herein by reference.

However, the scheme proposed by the Goebel et al. article is difficult to integrate, particularly for memory cell designs of different geometries, such as cells with capacitors that are above the silicon pillars, or active areas extending into the substrate.

In a preferred embodiment, a word line is formed surrounding the epitaxially grown silicon pillars and recessed into the field oxide such that the lowest point of the word line is beneath the highest point of the source region. Using this structure, the word line creates a p-type region in the silicon pillar that it surrounds. This creates a channel in which charge can move from the drain down to the substrate.

Forming Memory Cells

Figure 1B:
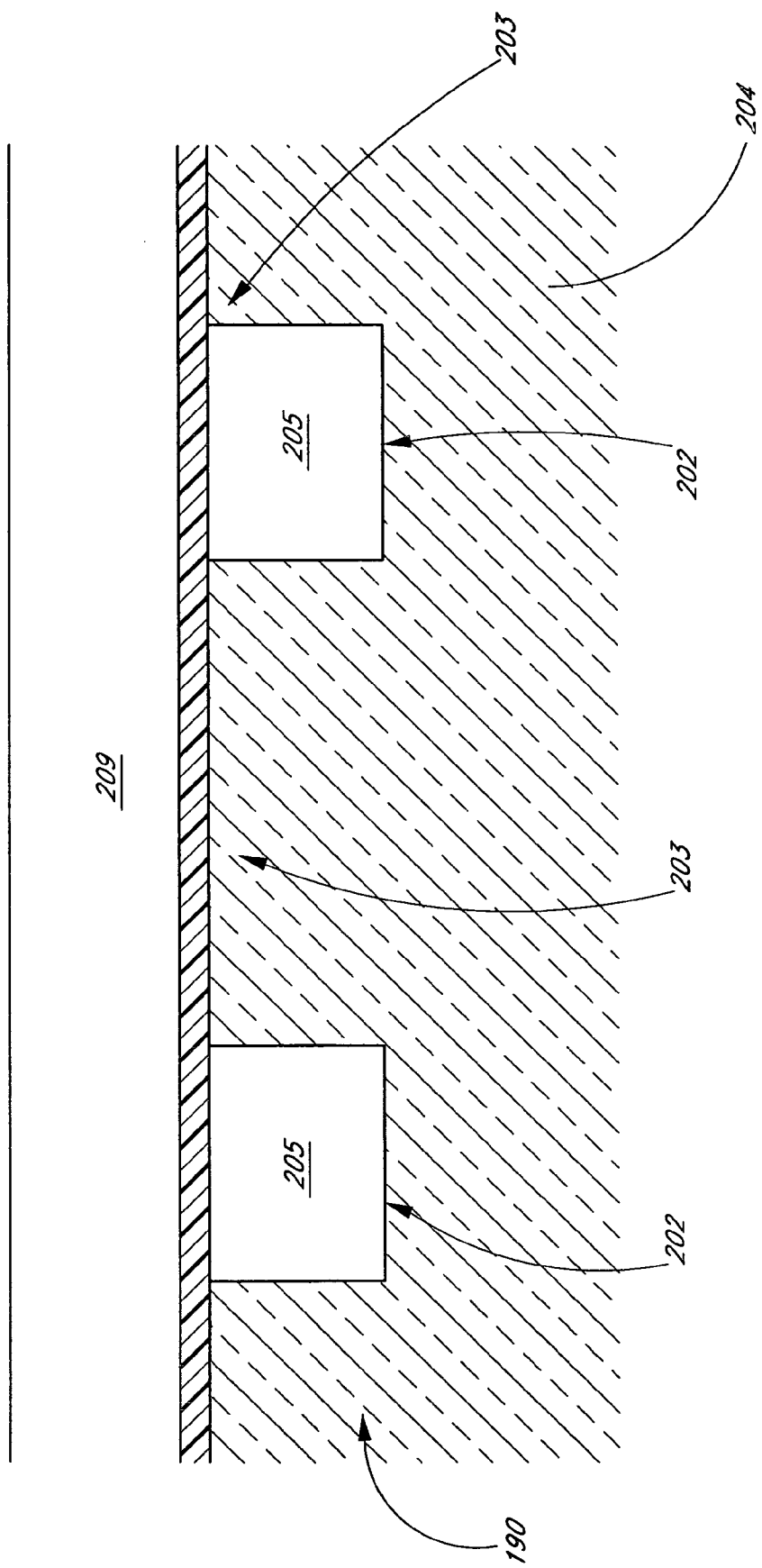
FIG. 1B is a schematic cross-section of the array of FIG. 1A along line 1B—1B of FIG. 1A.
Figure 1C:
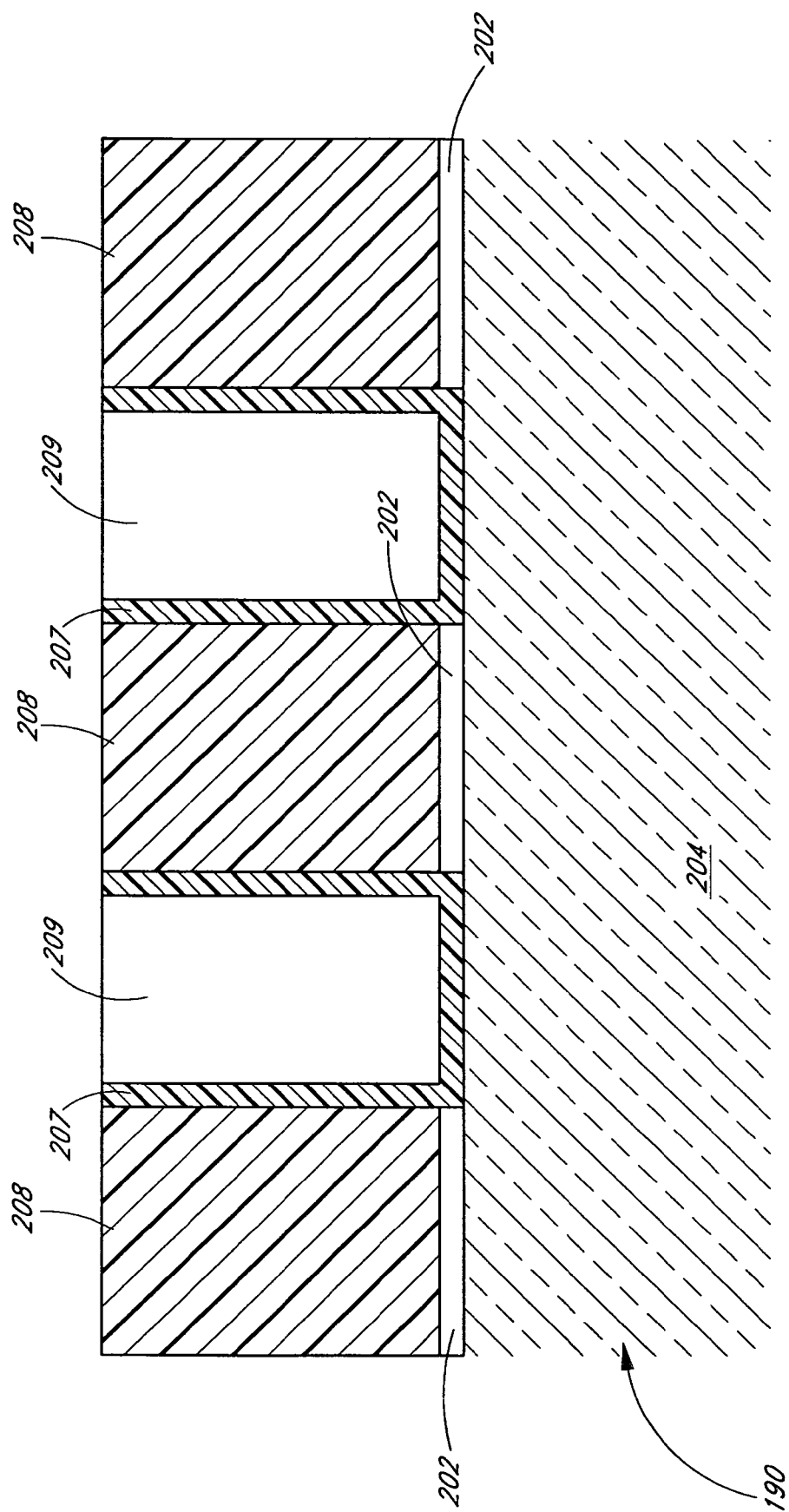
FIG. 1C is a schematic cross-section of the array of FIG. 1A along line 1C—1C of FIG. 1A.

In a preferred embodiment seen in FIGS. 1A–1C, a p-well 190 is formed within a semiconductor substrate 204 before forming masks 208, 209 (FIG. 1A) on the substrate. The formation of the masks 208, 209 is discussed below. In a preferred embodiment, the p-well 190 extends from the surface of the substrate to a depth of between about 5,000 Å and 10,000 Å, more preferably between about 8,000 Å and 9,000 Å. Skilled practitioners will appreciate that there are several ways to form the p-well region.

Also preferably prior to depositing the first mask 208 (nitride in the illustrated embodiment) and the second mask 209 (oxide in the illustrated embodiment), isolation trenches 202 (FIG. 1B) and substrate ridges 203 (FIG. 1B) are defined within the substrate. The isolation trenches 202 and the upper substrate ridges 203 preferably run vertically in FIG. 1A, (i.e. parallel to line 1C—1C). The trenches can be formed by forming a mask over the semiconductor substrate 204 and etching the substrate 204. Preferably, the substrate in the array is etched to a depth of between about 2000 Å and 4000 Å, more preferably between about 2500 Å and 3500 Å. As seen in FIG. 1B, the isolation trench 202 is filled with a field isolation material, such as field oxide 205. Preferably, the field oxide 205 is formed primarily using a spin-on deposition (SOD) oxide. The field oxide 205 may have additional layers. For example, the field oxide 205 may comprise, starting from the trench walls, a thin thermal oxide layer (e.g., less than about 100 Å), a thin nitride layer (e.g., less than about 100 Å), a TEOS oxide layer (e.g., less than about 200 Å), and a thick spin-on oxide to fill the remainder of the trench (e.g., about 5,000 Å).

FIG. 1C illustrates the first mask 208 and the second mask 209 over the p-well 190. In a preferred embodiment, the first mask 208 is silicon nitride, and the second mask 209 is silicon oxide. Preferably a pad oxide is formed on the surface of the substrate before the first mask 208 is formed. Once the first mask 208 is formed, a liner 207 is formed over the substrate and the first mask. In a preferred embodiment, the liner 207 comprises the same material as the first mask. The first mask preferably has a thickness of between about 2000 Å and 3000 Å. The regions that will form part of the transistor active areas are beneath the first mask 208. The active areas can be doped prior to formation of the masks, or during subsequent processing.

In a preferred embodiment, vertical transistors are formed using epitaxial silicon posts, which define part of the active area and include a vertical surround gate (VSG) channel. The epitaxial posts are formed in a similar fashion as the posts in the Brown patent, which is incorporated herein above. FIG. 1A is a plan view of an array before formation of the epitaxial posts. Two mask patterns are shown over a substrate 204. The first mask 208, preferably nitride, is deposited and patterned to form lines over the substrate. The liner 207 is formed in the gaps between lines of the first mask before the second mask 209 is formed between the lines of the first mask 208. Preferably, the second mask 209 is an oxide such as a tetraethyl orthosilicate (TEOS) oxide or a spin-on deposition (SOD) oxide. The alternating structure of the masks 208, 209 can be seen in FIG. 1C, a schematic cross section along line 1C—1C.

Figure 2A:
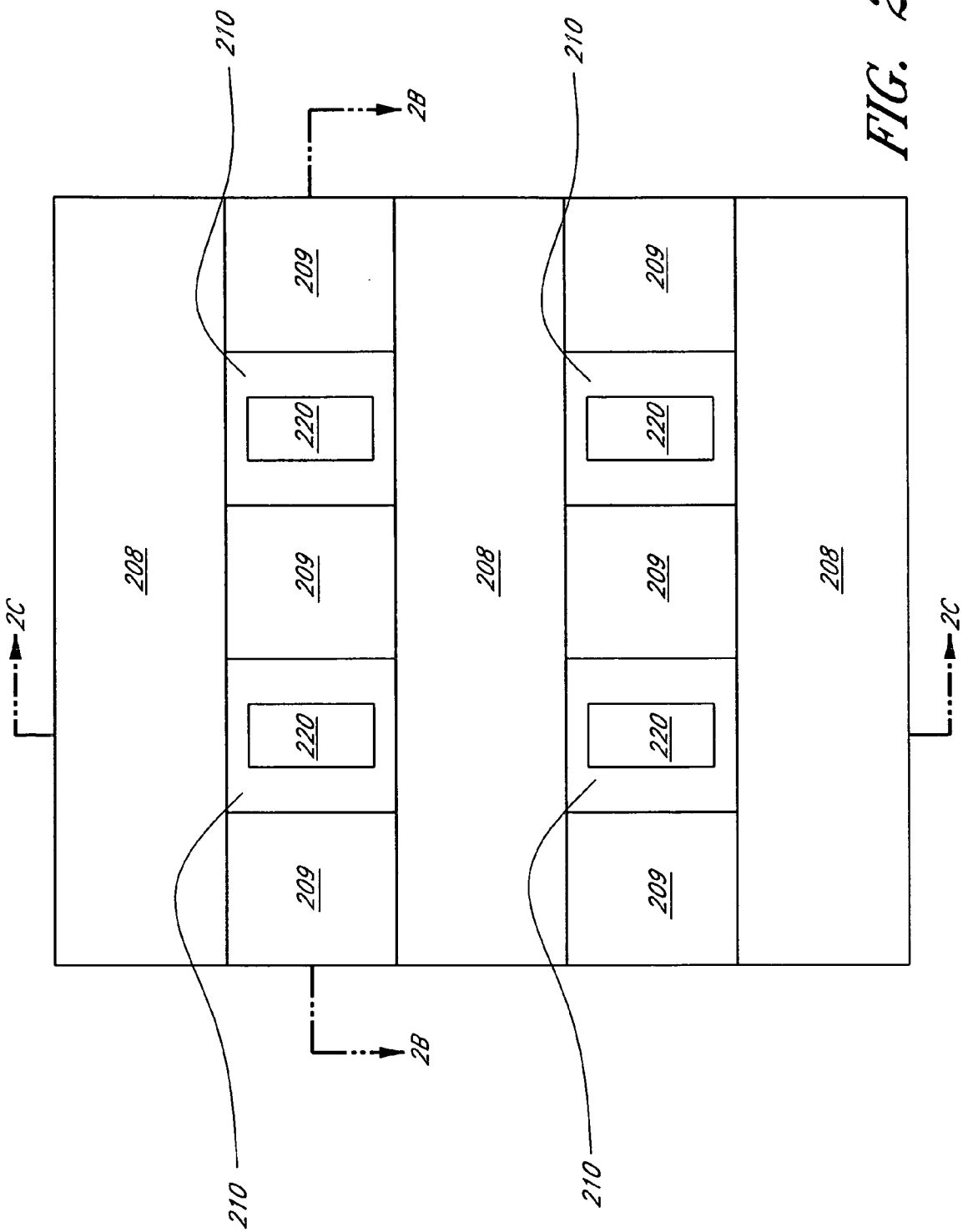
FIG. 2A is a schematic plan view of a memory array after formation of silicon pillars for the array.
Figure 2B:
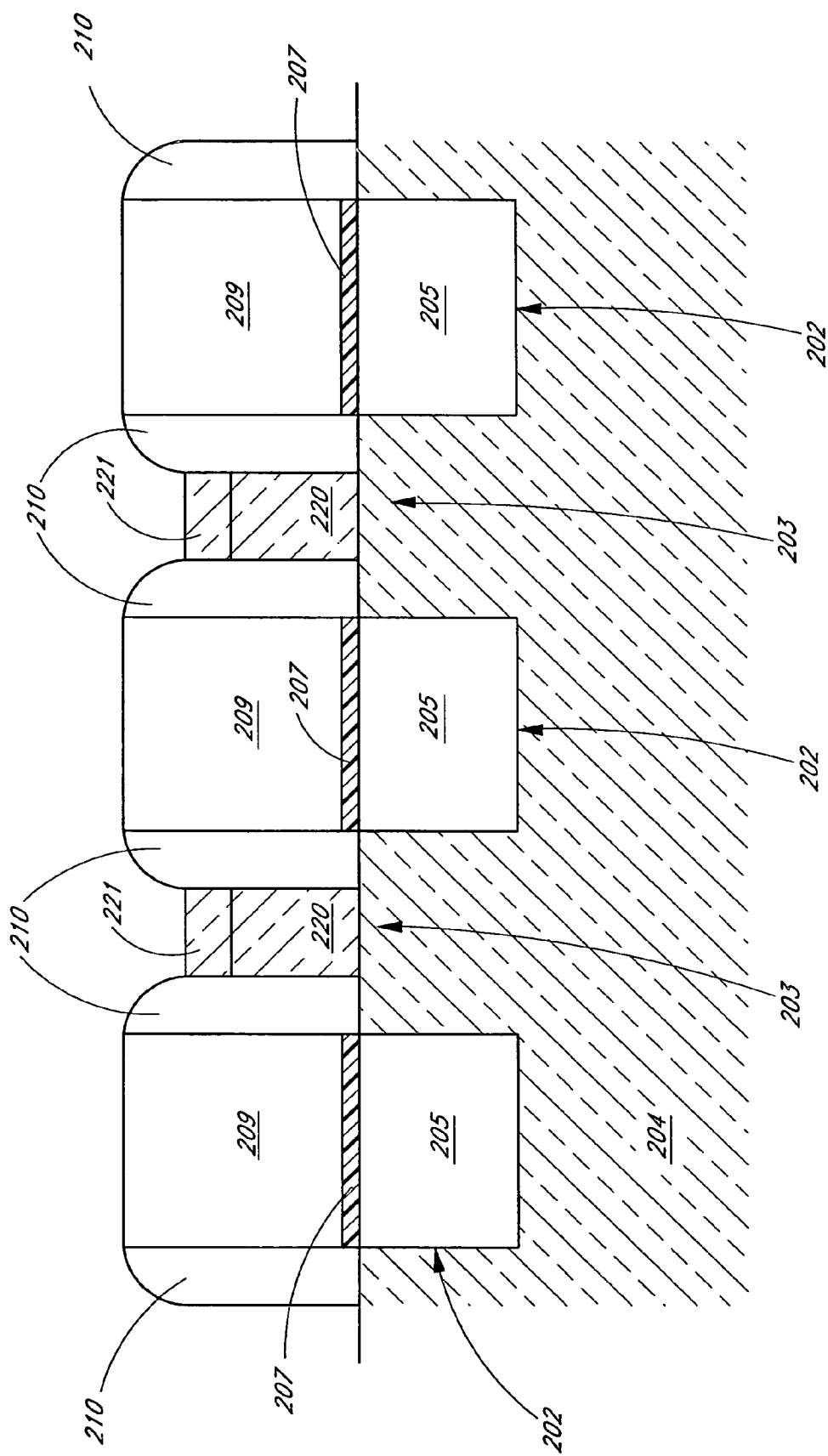
FIG. 2B is a schematic cross-section of the array of FIG. 2A along line 2B—2B of FIG. 2A.
Figure 2C:
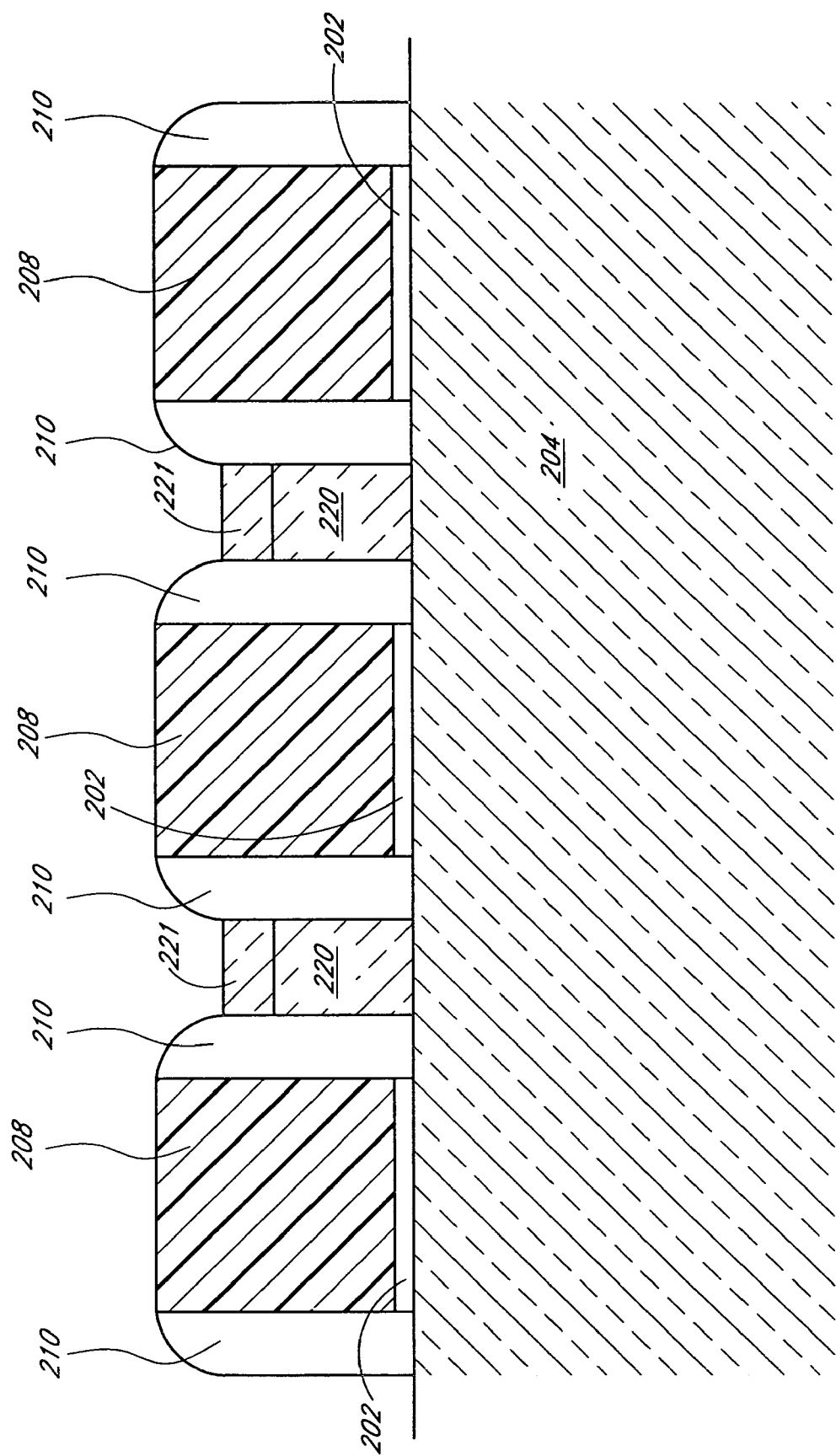
FIG. 2C is a schematic cross-section of the array of FIG. 2A along line 2C—2C of FIG. 2A.

In FIG. 2A, the second mask 209 has been patterned. In a preferred embodiment, the second mask is patterned by forming a perpendicular set of mask lines (not shown) and selectively etching to leave alternating blocks of mask and windows of exposed substrate. FIG. 2B is a schematic cross-section along line 2B—2B, and illustrates a spacer 210 lining the sidewalls of the window region above the exposed substrate. Preferably the spacer 210 is an oxide such as a TEOS oxide. A blanket layer of oxide is deposited over the substrate 204 and into the windows. A spacer etch is then performed to etch the horizontal surfaces of the oxide, forming the spacer 210 and exposing a smaller window of the substrate 204. In one embodiment, a thin nitride layer (not shown) can be formed over the spacer 210. The nitride layer is then spacer etched to allow for a hydrofluoric acid wet pre-clean step prior toe epitaxial deposition. Epitaxial silicon 220 is then selectively grown in the narrowed window on the substrate ridge 203. In a preferred embodiment, the epitaxial post 220 has a shape that is approximately rectangular or square. However, the shape of the epitaxial post 220 can also be a cylinder, or other geometric shapes.

As seen in FIG. 2B, a cross-section along line 2B—2B, the patterning of the second mask 209 forms islands upon the substrate 204. The islands of mask 209 and the lines of the first mask 208 define the windows on the portions of the ridges 203 over which the narrower epitaxial posts 220 are formed.

The silicon pillars 220 are formed using selective epitaxial growth (SEG) techniques known in the art. Preferably, the silicon pillars 220 are formed as undoped epitaxial silicon. A p-type dopant, such as boron, is preferably implanted in the pillars after the epitaxial growth. After the SEG step, the pillars 220 are recessed to a preferred height above the substrate 204. Preferably, the silicon pillars 220 have a height of between about 1200 Å and 2000 Å, more preferably between about 1400 Å and 1800 Å. Skilled practitioners will appreciate that the SEG step can use a variety of parameters to form the silicon pillars 220. In one embodiment, the drain region 221, which is preferably situated on the top of the pillar 220, can be formed by implanting an n-dopant in the top of the pillar. The upper active region 221 on the silicon pillar 220 preferably serves as the drain of the transistor. The drain regions 221 can be formed by implanting an n-dopant into the silicon pillars 220, either immediately after the SEG step, or at a later stage of processing. The drain regions 221 could also be formed by in situ doping during latter stages of SEG deposition after forming the channel or body of the pillar 220 as lightly p-doped silicon. Skilled practitioners will appreciate that the drain region can be doped at any of several different stages and by any of various different methods.

Figure 3B:
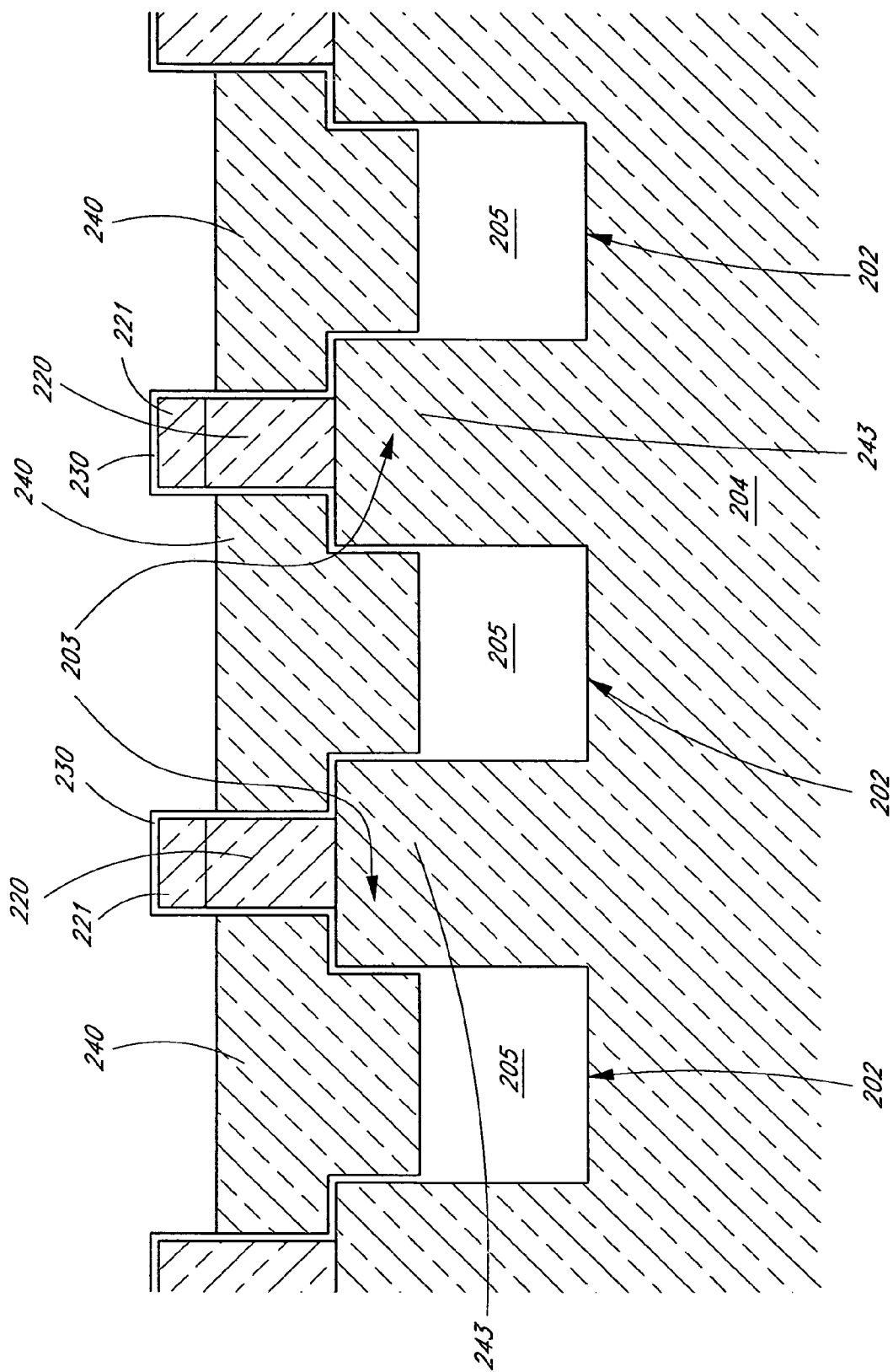
FIG. 3B is a schematic cross-section of the array of FIG. 3A along line 3B—3B of FIG. 3A.
Figure 3C:
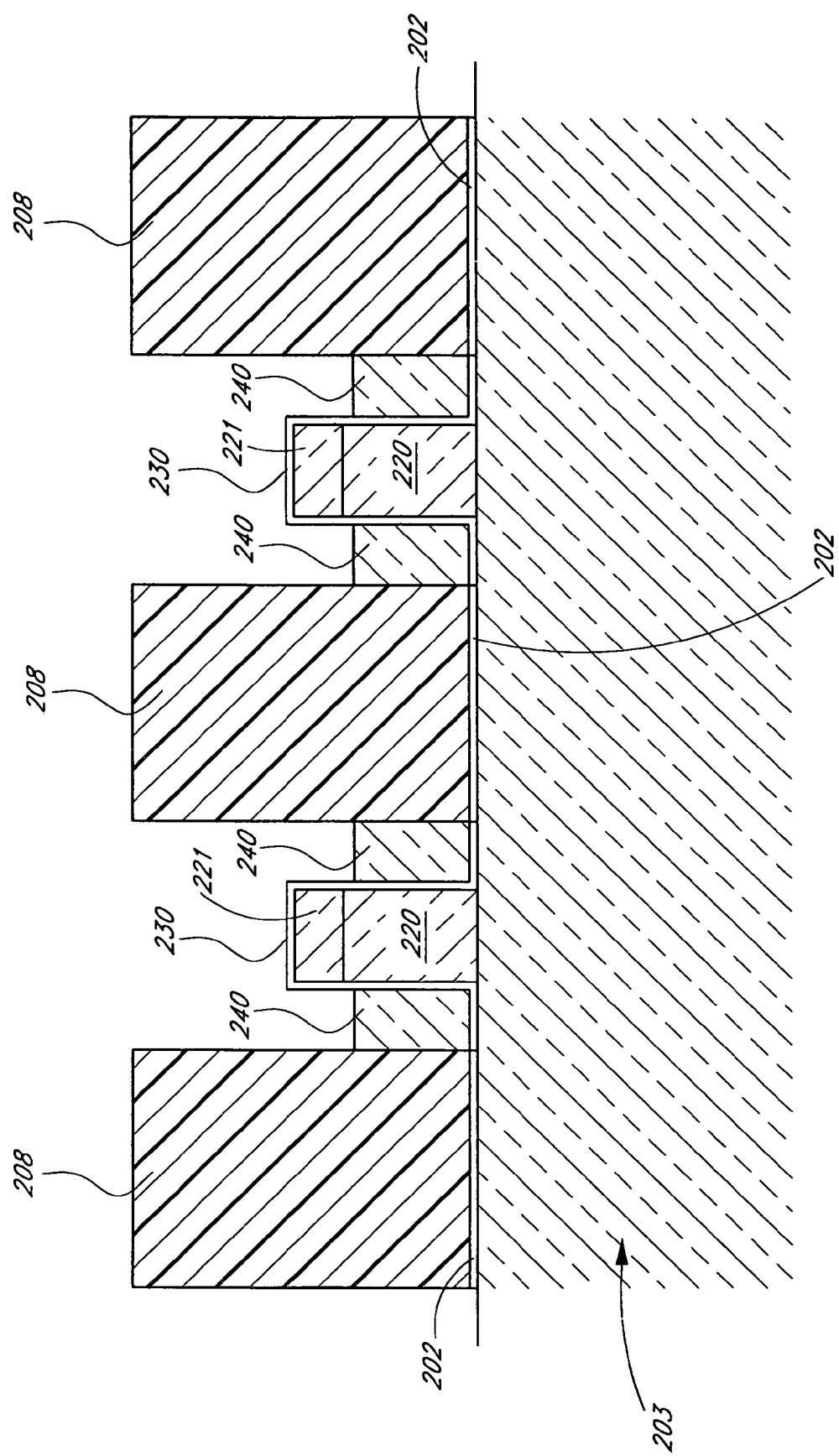
FIG. 3C is a schematic cross-section of the array of FIG. 3A along line 3C—3C of FIG. 3A.

In FIGS. 3A–3C, the second mask 209 and the spacers 210 have been removed. The silicon pillars 220 can be seen in columns atop the ridges 203 in the substrate 204. The field oxide 205 is recessed within the isolation trench either during or after the process of removing the second mask 209 and spacers 210. In a preferred embodiment, a buffered oxide etch (BOE) solution will be used to etch the oxide second mask 209 and spacers 210. The nitride liner 207 (FIG. 2B) acts as an etch stop for the BOE etch process. A short wet nitride strip is then performed to remove the nitride liner 207. In order to reduce the floating body effect, an oxide dry etch, preferably selective to the first mask 208 and the epitaxial silicon 220, is used to recess the field oxide 205 to a selected level. As discussed below, the selection of how far to recess the field oxide is based on both the floating body effect and gate capacitance. By recessing the field oxide 205, the gate 240 can extend beneath the height of the silicon ridge 203. While the timing of the recessing of the field oxide is described as being after the formation of the pillars 220, the field oxide 205 can also be recessed at other processing stages. For example, the field oxide 205 can be recessed after the deposition of the first mask 208 and before the formation of the nitride layer 207.

A conformal dielectric layer is formed over exposed silicon, including the exposed portion of the substrate ridges 203 and the silicon pillars 220. This dielectric layer will serve as the gate dielectric 230 (FIGS. 3B and 3C) over the pillars 220. In the illustrated embodiment, a thermally grown gate oxide 230 formed over the substrate ridge 203 will isolate the pillars 220 from the word lines 240. The gate oxide 230 is preferably formed by thermal oxidation or an oxide, such as a high dielectric constant oxide, could be deposited. In a preferred embodiment, the gate dielectric 230 is formed to be quite thin. Preferably, the gate dielectric 230 is between about 10 Å and 100 Å, more preferably between about 60 Å and 80 Å.

The word lines 240 are deposited surrounding the gate dielectric 230 and over the field oxide 205. Preferred materials for the word line include doped poly or a fully silicided conductor, such as $CoSi_2$ or NiSi. Preferably a blanket layer of word line material is deposited over the array. The word line material is recessed back to form the word lines 240, which act as gates for the vertical transistors. After patterning the word lines 240, each word line 240 will surround a row of pillars 220 running in a direction perpendicular to the trenches 202 and ridges 203. By extending the gates/word lines 240 below the original height of the substrate 204, the problem of the floating body effect is alleviated. The electrical path from drain regions 221 to the substrate 204 is kept intact by the presence of the word line material 240. Thus, there are available carriers in the pillar to allow charge to move down the pillar 220 when the transistor is "off". Drain regions 221, situated at the top of the pillars 220, are thus "tied" to the substrate due to the lower extension of the gates 240.

However, by dropping the gates 240 into the isolation trenches 202, gate capacitance is increased. Therefore, the depth to which the field oxide 205 is recessed and the word lines 240 extend into the trenches 202 is a balance between competing interests: the reduction of the floating body effect and the gate capacitance. In a preferred embodiment, the field oxide is recessed (and the word line 240 or gate extends downwardly) relative to the upper surface of the substrate ridge 203 by between about 0 Å and 1500 Å, more preferably between about 500 Å and 1000 Å. Depending on the application and the concerns of gate capacitance and floating body effect particular to the application, the depth to which the field oxide 205 is recessed can be varied.

The depletion regions that can cut off the pathway from the upper active region 221 to the substrate 204 can be measured in several ways. A common way to measure the depletion region is by measuring the midgap potential, the electrostatic potential in the substrate 204 at the center 243 of the ridge 203 between source regions. Because of the shape and location of the source regions 206 (namely on either side of but not beneath the pillars 220), they can be seen in FIG. 3C, but not FIG. 3B. The ridge 203 beneath and extending away from each pillar 220 forms a part of the transistor channel. Using the recessed word line 240, the electrostatic potential is reduced directly beneath the drain 221. Without using the recessed gate, depletion regions in the substrate can meet. For example, without using the recessed word line 240, the midgap potential was simulated to be approximately 1.5 eV. However by using the recessed gate, the midgap potential falls in simulations to approximately 0.1 eV. Preferably, the use of the recessed word line 240 causes a reduction in midgap potential of greater than about 75%, more preferably greater than 85%.

Figure 4B:
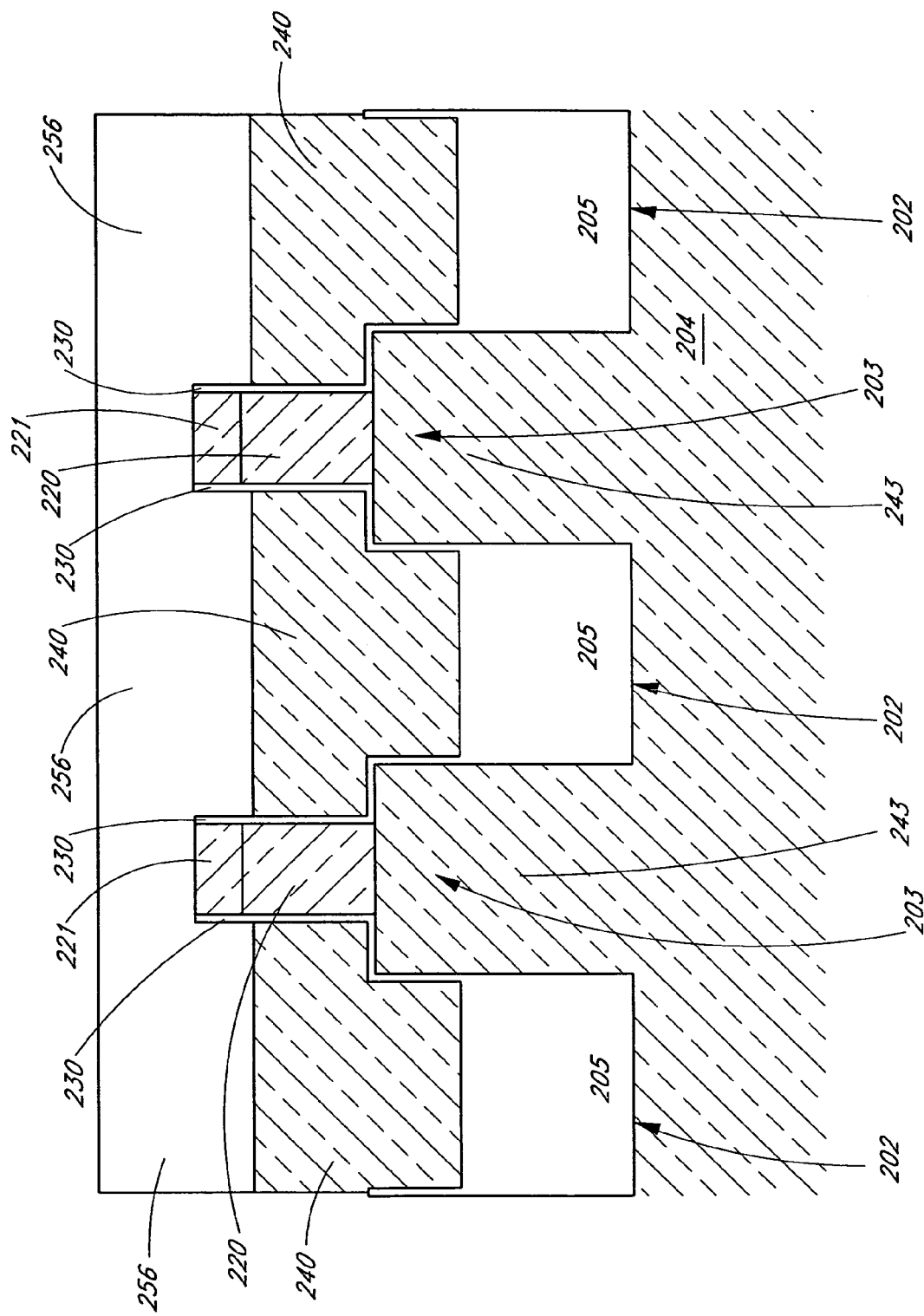
FIG. 4B is a schematic cross-section of the array of FIG. 4A along line 4B—4B of FIG. 4A.
Figure 4C:
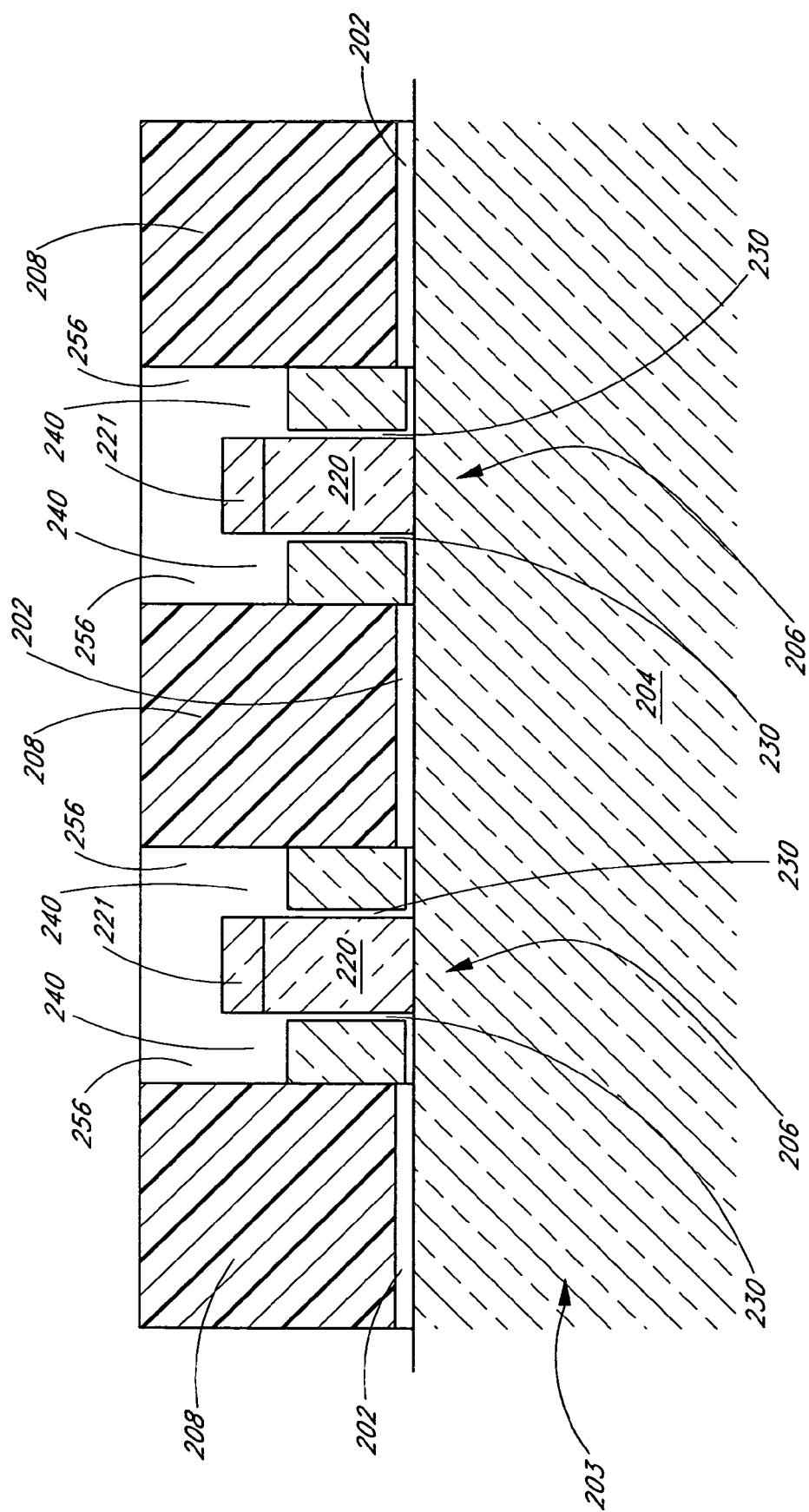
FIG. 4C is a schematic cross-section of the array of FIG. 4A along line 4C—4C of FIG. 4A.

FIGS. 4A–4C show vertical transistors after the deposition of an insulation layer 256 and a planarization of the upper surface down to the top of the first mask 208. Because the first mask 208 is approximately 1000 Å taller than the pillar, some of the insulation layer 256 will remain over the pillars 220. In a preferred embodiment, the insulation layer 256 is an oxide, such as undoped silicon glass (USG), borosilicate glass (BSG), phosphosilicate glass (PSG), or borophosphosilicate glass (BPSG). The upper surface is then planarized, preferably using a stop on nitride chemical mechanical polish (CMP) step. By using a stop-on-nitride CMP step, a sufficient insulation layer 256 will remain after the CMP step.

Figure 4D:
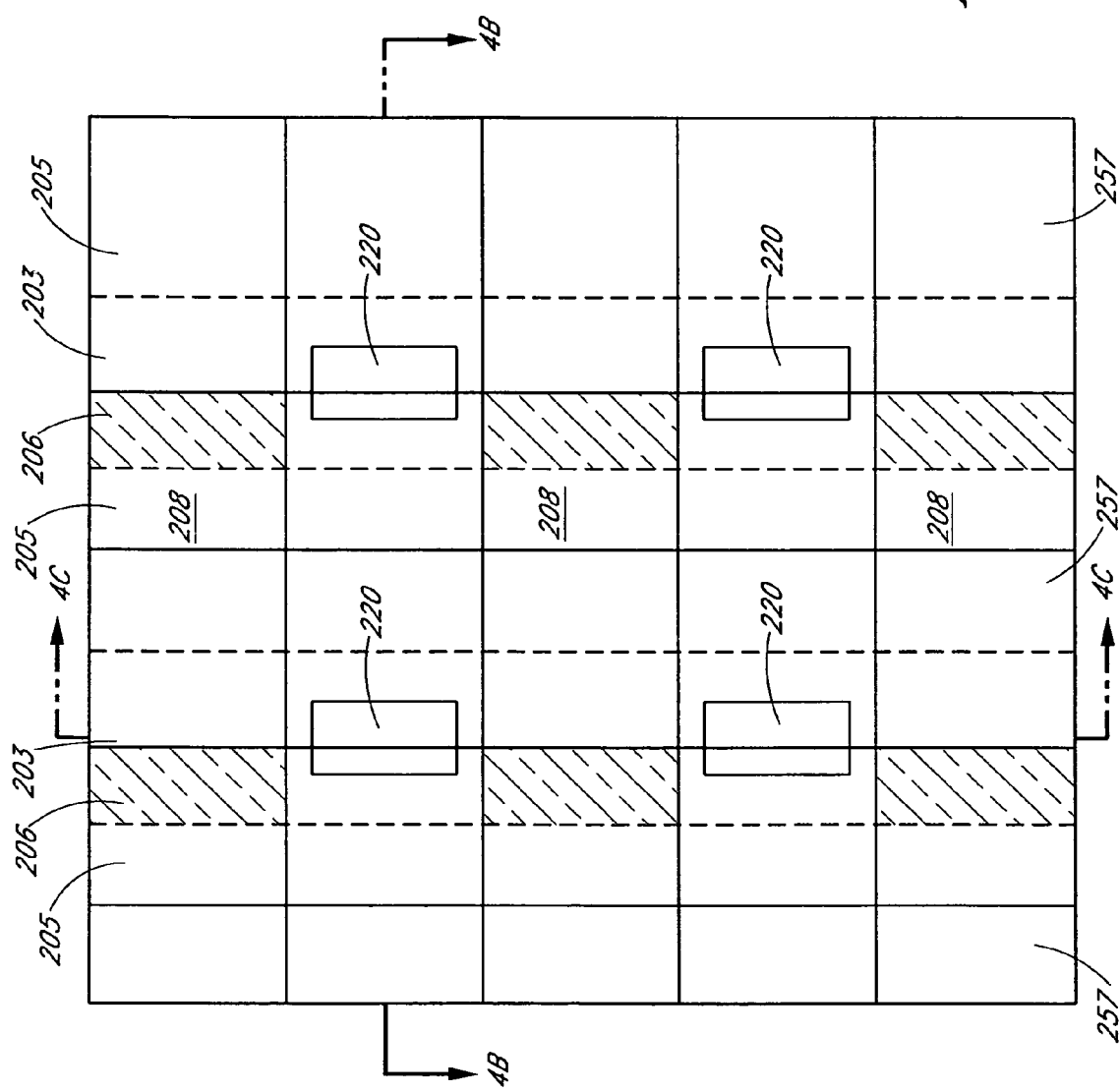
FIG. 4D is a schematic plan view of the memory array of FIG. 4A after formation of source regions.

In a preferred embodiment, the source regions may be formed after the planarization of the insulation layer 256 and before the formation of the digit lines. In FIG. 4D, a mask 257 is formed over the array of FIG. 4A. Preferably the mask 257 is parallel to the substrate ridges 203. The mask 257 preferably covers half of the substrate ridge 203 and is over half of the field oxide 205. The mask 257 is used to remove a portion of the first mask 208. Once the first mask 208 is patterned and etched, a portion of the substrate ridge 203 and the field oxide 205 will be exposed. The exposed region of the substrate ridge 203 can be implanted with a dopant in order to form the source region 206. In a preferred embodiment, an n-type dopant is implanted. The implantation preferably does not substantially affect the properties of the exposed portion of the field oxide 205.

Figure 5A:
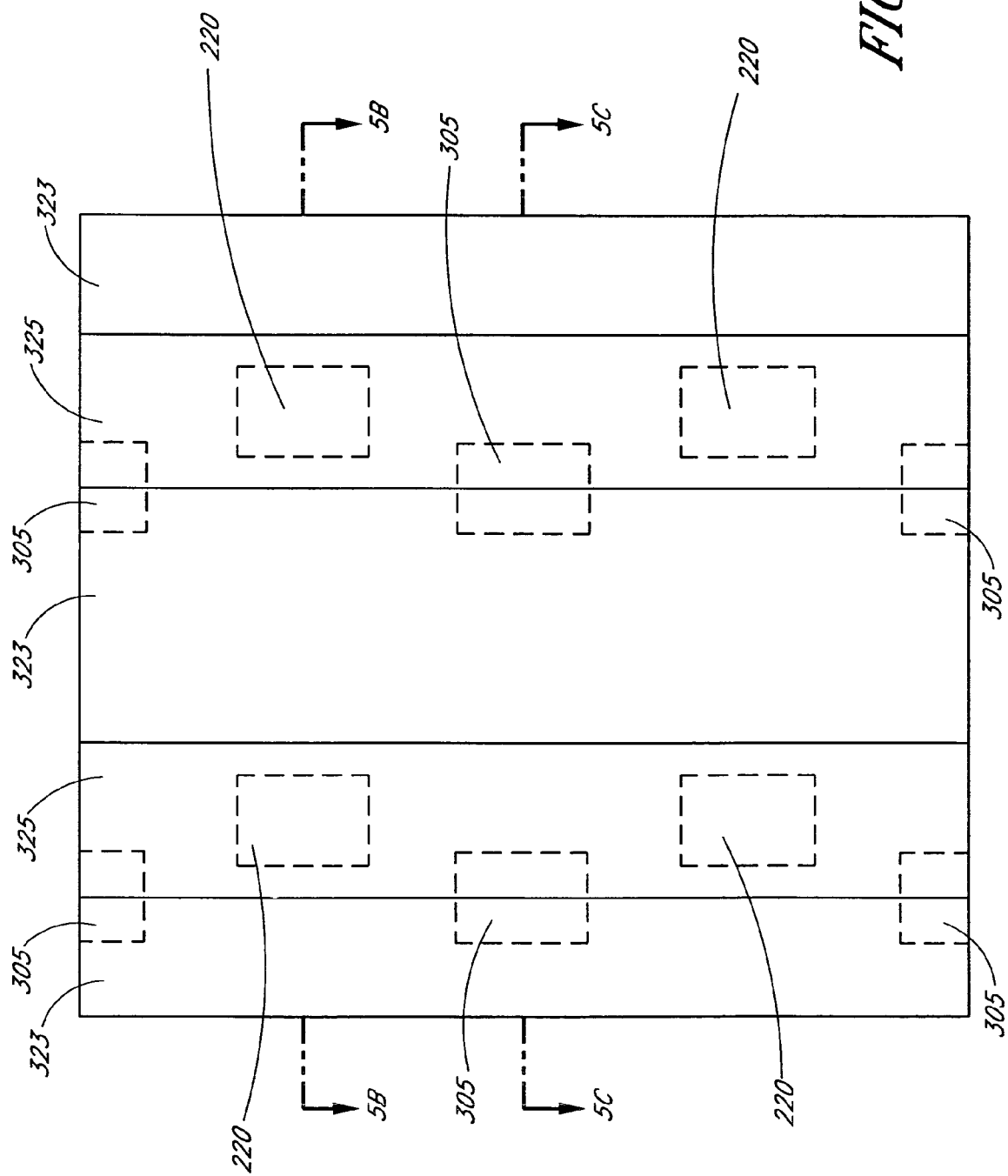
FIG. 5A is a schematic plan view of a memory array after formation of digit lines for the array.
Figure 5B:
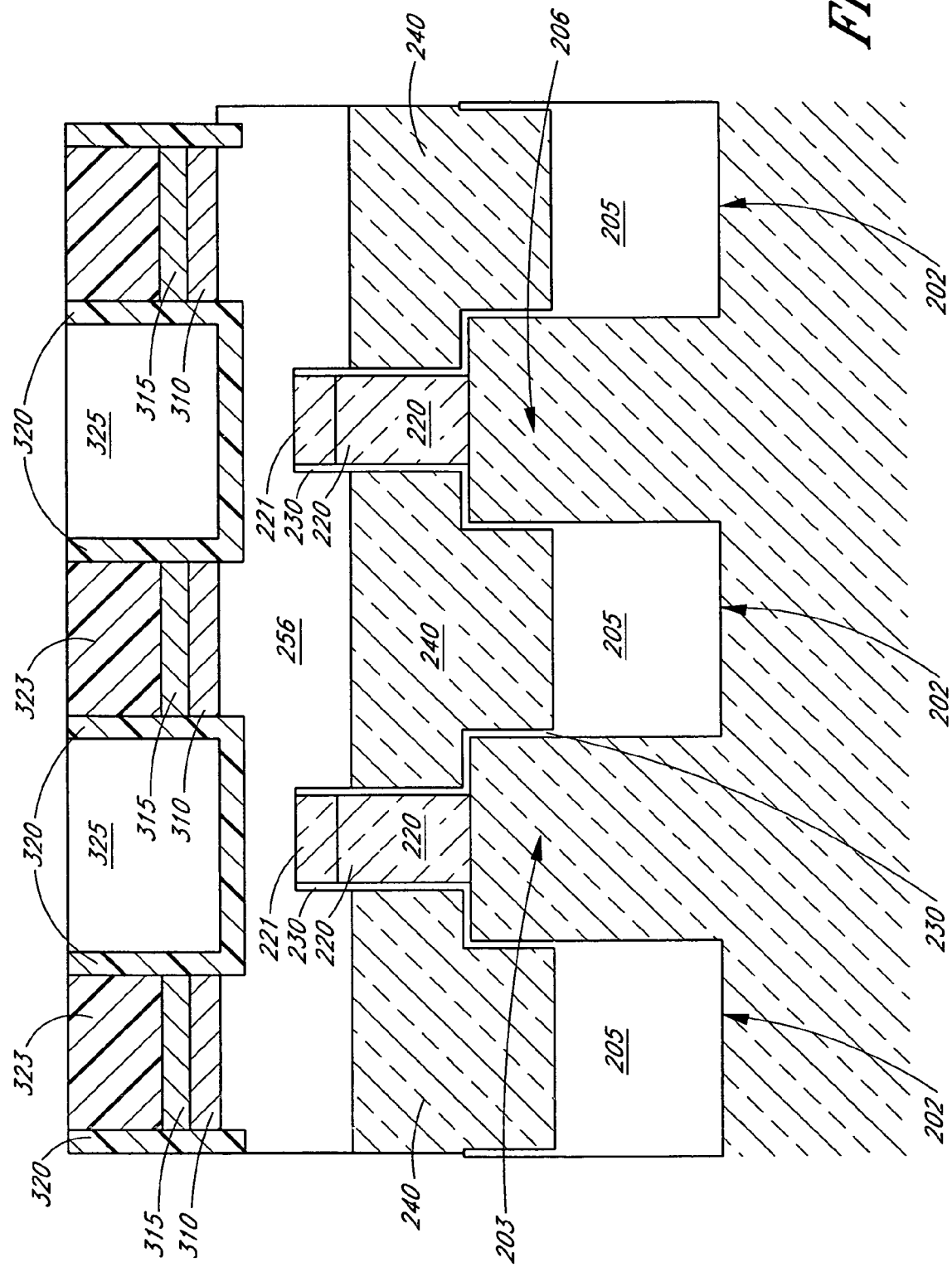
FIG. 5B is a schematic cross-section of the array of FIG. 5A along line 5B—5B of FIG. 5A.
Figure 5C:
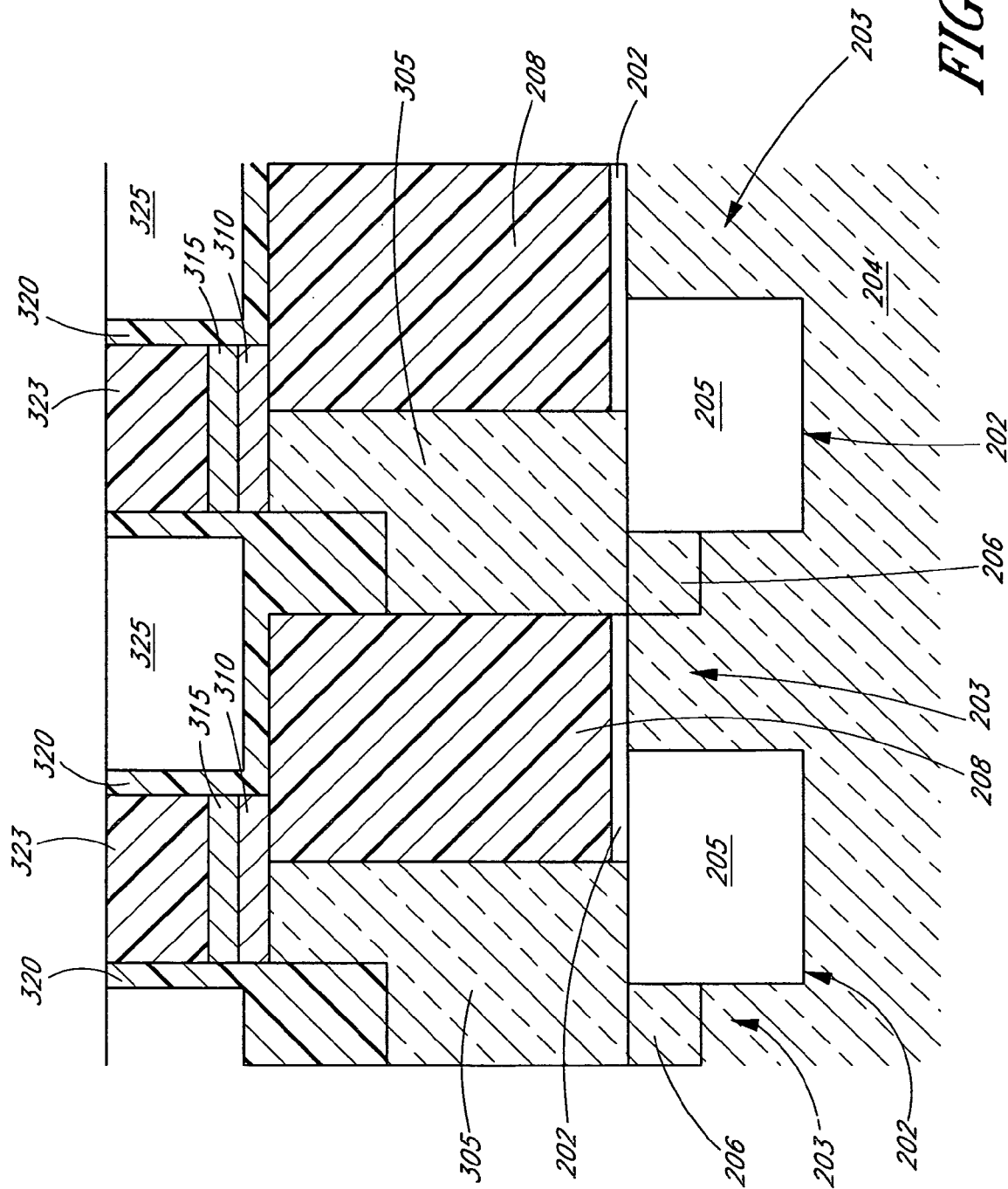
FIG. 5C is a schematic cross-section of the array of FIG. 5A along line 5C—5C of FIG. 5A.

FIGS. 5A–5C illustrate the formation of digit lines that will be buried by an interlayer dielectric, in which the cell capacitor is formed. In FIG. 5B, a schematic cross-section is seen through a row of pillars 220. In a preferred embodiment, the active areas of the transistor, i.e. the source and the drain, are formed before formation of the digit lines. The drain regions 221 may be formed at several stages of processing when the top of the pillar 220 is exposed. The source regions 206, the formation of which is discussed above, are seen in FIG. 5C. The digit line 315, which is over a digit line contact 310, is seen over the field oxide 205. Preferably, the digit line 315 runs perpendicular to and above the word line 240.

FIG. 5C illustrates the formation of a digit line plug 305 to connect the digit line 315 to the source region 206 of the transistor. By exposing the source region 206 as discussed with reference to FIG. 4D above, the fabrication of a contact plug 305 connecting the source region 206 and the digit line 315 is facilitated. In a preferred embodiment, the digit line plug 305 is offset from the isolation trench 202 by F/2 (i.e. half of the minimum printable feature size). Preferably, the digit line plug 305 is a conductive material, more preferably a polysilicon layer, most preferably n-doped poly.

The digit line plug 305 contacts the lower portion of the digit line 310. In a preferred embodiment, the digit line is multi-layered. The lower portion of the digit line 310 and the upper portion of the digit line 315 are offset by F/2 as well. This allows the digit line 315 to be formed over the isolation trench 205. Forming the digit line over the trench 205 can prevent interference caused by the digit line 310 and 315.

In a preferred embodiment the lower portion of the digit line 310 is metallic, such as a conductive nitride like titanium nitride. More preferably the lower portion of the digit line 310 is metal mode titanium nitride, a TiN layer that has a high titanium concentration and is particularly conductive. Skilled artisans will appreciate that there are several methods of forming such a layer, including chemical vapor deposition (CVD) and atomic layer deposition (ALD). Preferably, the upper portion of the digit line 315 is a conductor, more preferably a highly conductive metal, most preferably tungsten. An insulating liner 320 is preferably deposited around the digit line 310 and 315. The insulating liner 320 can also be deposited in a recess in the digit line plug 305. An insulation layer 323 is deposited over the upper portion of the digit line 315. Preferably the insulation layer 323 is a silicon nitride layer.

Preferably the digit line layers 310 and 315, and the insulation layer 323 are formed by depositing blanket layers over the partially fabricated array of FIGS. 4A–4C. A photoresist mask is preferably formed in order to pattern these layers and an anisotropic etch process is used to etch them. The nitride liner 320 can then be deposited over the edges of the digit line layers 310 and 315, and the insulation layer 323. A nitride punch or spacer etch is preferably formed to contact the silicon posts 220. If the drain regions 221 have not been doped, they can be doped after the spacer etch is performed to expose the silicon posts 220. An oxide layer 325 is preferably deposited over the array before a planarization process, preferably a CMP step.

After the digit line 315 and its associated layers are formed, a cell capacitor is formed over the vertical transistor to complete the memory cell. In a preferred embodiment, a container capacitor is formed over the vertical transistor.

Figure 6A:
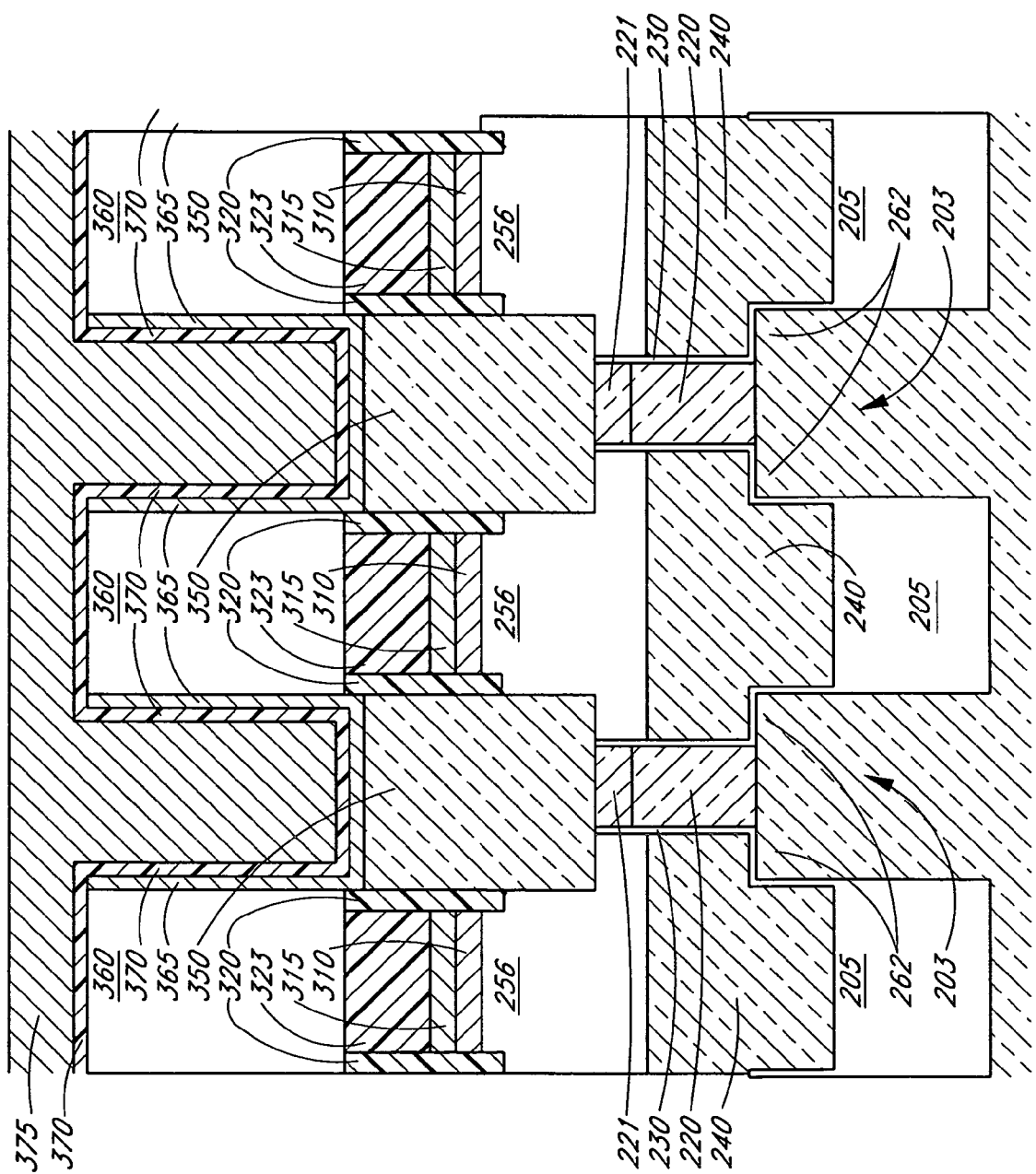
FIG. 6A is a schematic cross-section of the array of FIG. 5A after formation of cell capacitors to complete the memory cells.

Referring now to FIG. 6A, a cross section of two memory cells, the oxide layer 325 is removed over the silicon posts 320 and a cell contact plug 350 is formed. Preferably, the plug 350 is a conductor, more preferably the plug 350 is a polysilicon layer. A structural layer 360 is formed over the insulating layer and the plug 350. Preferably the structural layer 360 is an oxide, such as BSG, PSG, or BPSG. The structural layer is masked and etched to form a recess over and exposing each plug 350 in the array.

A lower capacitor electrode 365 is conformally formed within the recess and over the structural layer. The lower electrodes 365 are preferably etched or polished back to isolate each electrode from its neighboring cells. Preferred materials for the lower electrodes 365 include metals, such as tungsten, metal compounds, such as titanium nitride, and polysilicon. A blanket layer of a capacitor dielectric 370 is then conformally formed over the array. The capacitor dielectric 370 does not need to be etched to be isolated from neighboring cells. Rather, in a preferred embodiment, the capacitor dielectric 370 can be one layer for the entire array. Preferred materials for the capacitor dielectric 370 include metal oxides, such as tantalum oxide, aluminum oxide, hafnium oxide, and zirconium oxide.

Figure 6B:
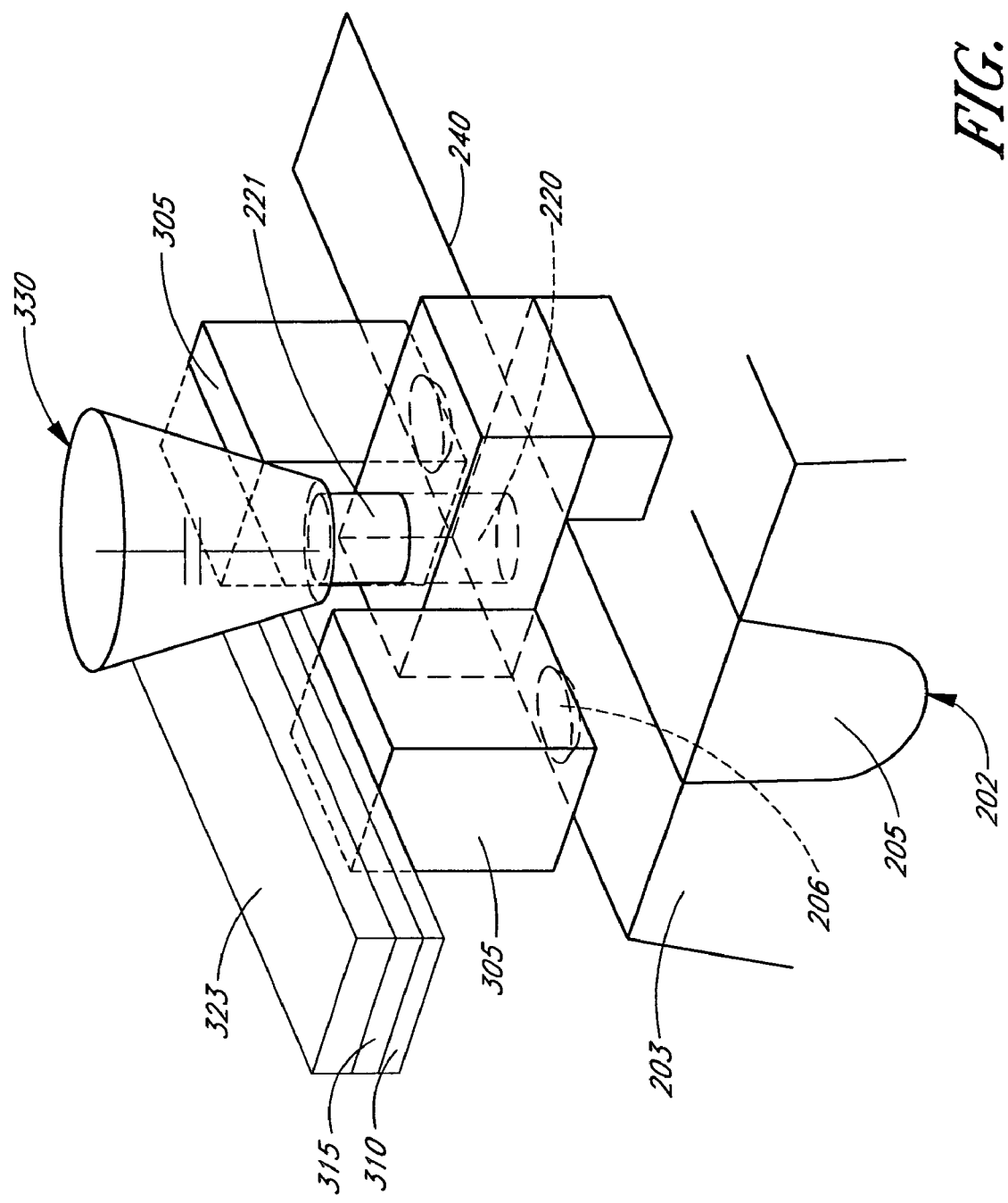
FIG. 6B is a schematic three dimensional view of the array of FIG. 5A after formation of cell capacitors to complete the memory cells.

Finally, an upper electrode 375 is formed over the array. The material for the upper electrode 375 is preferably blanket deposited over the array. Like the capacitor dielectric 370, the upper electrode does not need to be isolated from neighboring cells; a single electrode layer 375 can serve as the upper or reference electrode for multiple capacitors or the whole array. Preferred materials include metals, such as tungsten, and metal compounds, such as titanium nitride and tungsten silicide ($WSi_x$). The upper electrode 375 can also comprise multiple films. For example, the upper electrode 375 can comprise a layer of titanium nitride, a layer of polysilicon, and a layer of tungsten silicide. FIG. 6B shows a schematic three dimensional view of a cell. The word line 240 can be seen descending below the ridge 203 into the trench 202.

In another embodiment, the structural layer 360 can be removed prior to depositing the capacitor dielectric 370. This would allow both the inside and the outside of the lower container electrode 365 to be used to increase the capacitance. The capacitor dielectric 370 and the upper electrode 375 would then be formed conformally over the lower electrode 365 and over the insulating layer 323. An insulator is deposited over the array before the array is planarized, preferably using a CMP step.

Figure 7:
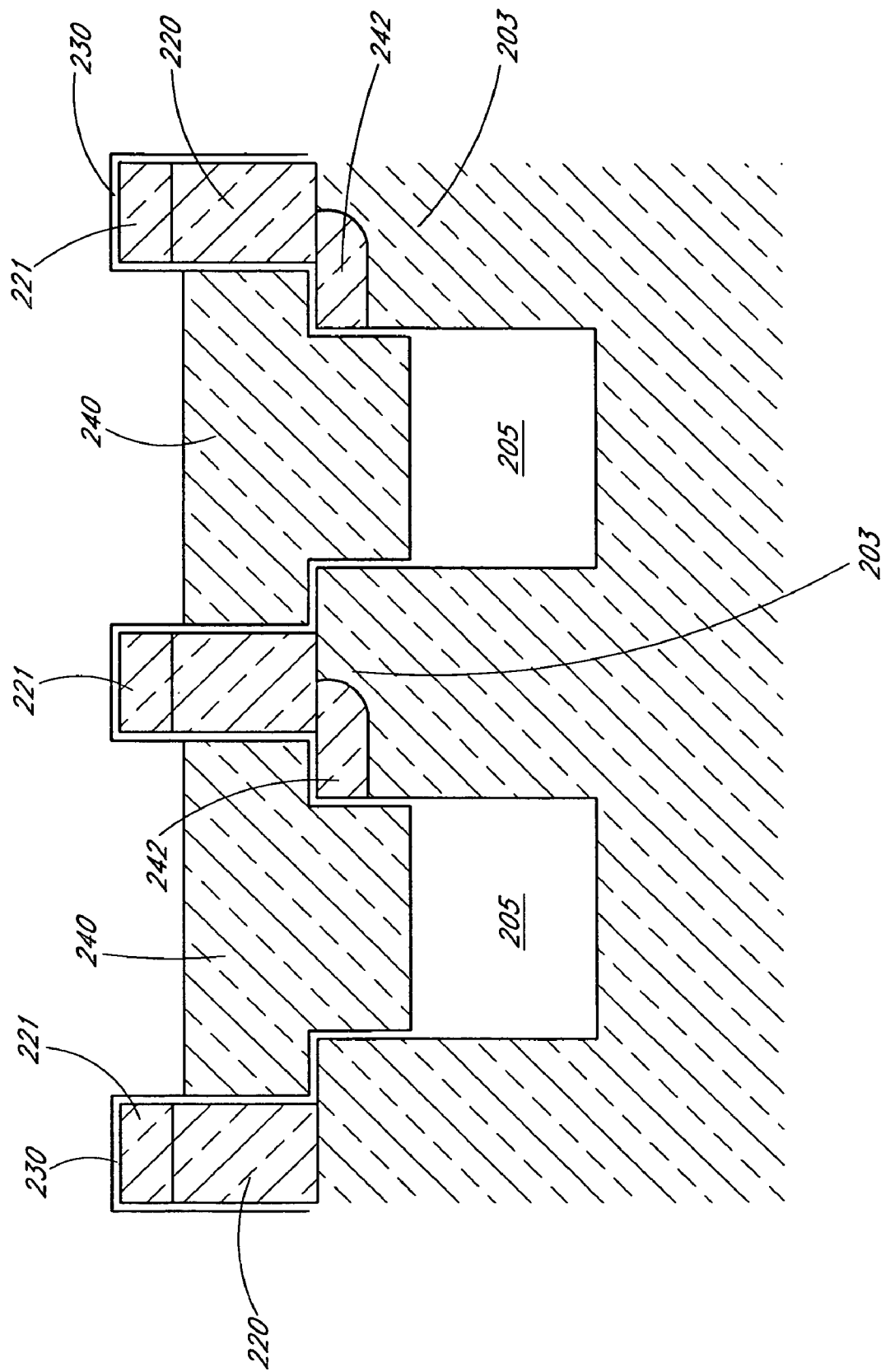
FIG. 7 is a schematic cross-section illustrating an alternative embodiment to FIG. 3B.

Another embodiment is illustrated in FIG. 7, where the array is seen at the stage of processing corresponding to FIG. 3B of the first embodiment. In this embodiment, a portion 242 of the substrate ridge 203 beneath the pillar 220 is implanted with an n-type dopant before the word lines 240 are formed. This extends the source regions 206 to overlap with the pillars 220. This extended source 242 can be formed directly beneath the pillar 220, or it can stop at the edge of the pillar 220. This allows the depletion field to spread further down the silicon post 220 rather than through the whole width of the silicon post. The doped portion 242 is preferably formed before the word line is formed and after the active areas and the isolation trenches are formed. In a preferred embodiment, the doped portion 242 is used in combination with the word line 240 dropped into the field oxide 205.

Structure

Two memory cells are seen in FIG. 6A. N-doped source regions 206 are formed in the array and can be seen FIG. 5B and serve as the source for the transistors. Isolation trenches 202 are formed within a substrate 204. A silicon pillar 220 extends over a plateau or ridge 203 in the substrate 204, so that it is bordered on two sides by a ledge 262 because the pillar 220 is narrower than the width of the substrate ridge 203. Preferably, the other two sides of the pillar 220 are facing the length of the substrate ridge 203. The source region 206 is formed in the substrate ridge 203. The silicon pillar 220 and portions of the ridge 203 are lined by a gate dielectric 230. A word line 240, which is dropped into the isolation trench 202 surrounds a row of silicon pillars 220. The word line 240 follows the gate dielectric 230 around the pillar and down along the sides of ledge 262 into the isolation trench 202.

An isolation material 256 separates the word line 240 from the digit line conductors 310 and 315, which is connected to the active area 206 through a digit line plug (not pictured). The pillars 220 can also vary from the embodiments described herein. For example, the pillar 220 can be etched from the substrate, the pillar could take other shapes, or the doping could be opposite (i.e. n-doped versus p-doped) from those discussed above. Also, the source region 206 may be extended to overlap with the pillar 220 by doping an additional portion of the ridge 203.

A capacitor contact plug is connected to the silicon post 220 and to the lower capacitor electrode 365 The lower electrode is formed within a structural layer 360. A capacitor dielectric 370 is formed over the structural layer 360 and within the lower electrode 365. An upper electrode layer 375 is formed over the capacitor dielectric 370. An insulator can be deposited over the array to isolate the array during subsequent processing.

FIG. 6B is a schematic three dimensional view of the cell, which omits several parts of the cell in order to clearly show the remaining parts. Preferably, a drain 221 is situated on the top of the pillar 220, and a source 206 is situated within the silicon ridge slightly offset from the pillar 220. While a capacitor plug (350 in FIG. 6A) is used in preferred embodiment, it is not shown over the drain in FIG. 6B in order to show the relative position of the capacitor 330 to the digit line layers 310 and 315. Additionally, the layer 310 is shown only with the plug 305 underneath it. However, the digit line layers 310 and 315 are also supported over the substrate 204 by the oxide layer 256 (FIG. 6A) and several other layers which are not shown in FIG. 6B. The source contacts the digit line plug 305 in order to form an electrical connection with the digit line. An insulator layer 323 is over the digit line. The capacitor 330, positioned over the drain 221, is shown only schematically in FIG. 6B, but is preferably a container capacitor as described in reference to FIG. 6A.

Although the foregoing invention has been described with reference to certain exemplary embodiments, other embodiments will become apparent in view of this disclosure. Therefore, the described embodiments are to be considered only as illustrative and not restrictive. The scope of the present invention, therefore, is indicated by the appended claims and their combination in whole or in part rather than by the foregoing description. All changes thereto would come within the meaning and range of the equivalence of the claims are to be embraced within their scope.

I claim:

1. A memory array for a DRAM comprising:
    a plurality of source regions on a plurality of substrate ridges, each substrate ridge having a top point;
    a plurality of isolation trenches positioned between the substrate ridges;
    a plurality of silicon pillars positioned in columns on the top points of the substrate ridges between source regions;
    a plurality of word lines that each surround a row of silicon pillars, wherein the word lines are substantially recessed into the isolation trenches to a depth below the top points of the substrate ridges;
    a plurality of digit lines positioned above the silicon pillars; and
    a cell capacitor overlying each silicon pillar.

2. The array of claim 1, wherein the word lines comprise polysilicon.

3. The array of claim 2, wherein the word lines comprise n-doped polysilicon.

4. The array of claim 1, wherein a bottom point of the word lines is below the top point of the substrate ridge by between about 500 Å and 1000 Å.

5. The array of claim 1, wherein the digit lines comprise a metal.

6. The array of claim 5, wherein the digit lines comprise tungsten.

7. The array of claim 1, further comprising a gate dielectric surrounding each silicon pillar.

8. The array of claim 1, further comprising:
    a digit line plug over each source region; and
    a digit line contact connecting the digit line to the digit line plug.

9. The array of claim 8, wherein the digit line plug is offset by ½ F from the source region.

10. The array of claim 8, wherein the digit line contact is offset by ½ F from the digit line plug.

11. The array of claim 8, wherein the digit line plug comprises n-doped polysilicon.

12. The array of claim 8, further comprising an insulating layer over the digit line.

13. The array of claim 12, further comprising a liner surrounding the digit line contact, the digit line, and the insulating layer over the digit line.

14. The array of claim 1, wherein the cell capacitor comprises a container capacitor.

15. The array of claim 1, wherein the cell capacitor comprises:
   a lower electrode contacting a capacitor plug connected to the silicon pillar;
   a capacitor dielectric over the lower electrode; and
   an upper electrode over the lower electrode and the dielectric layer.

16. The array of claim 15, wherein the capacitor dielectric comprises a conformal capacitor dielectric on both an interior and an exterior face of the lower electrode.

17. The array of claim 15, wherein the capacitor dielectric comprises a metal oxide.

18. The array of claim 15, wherein the lower electrode comprises titanium nitride.

19. A memory array for a DRAM comprising:
   a plurality of source regions on a plurality of substrate ridges;
   a plurality of isolation trenches positioned between the substrate ridges;
   a plurality of silicon pillars positioned in columns on the substrate ridges between source regions;
   a plurality of word lines that each surround a row of silicon pillars, wherein the word lines are substantially recessed into the isolation trenches to a depth below a top point of the substrate ridges;
   a plurality of digit lines positioned above the silicon pillars; and
   a cell capacitor overlying each silicon pillar,
   wherein the silicon pillars comprise epitaxially grown silicon.

20. A memory array for a DRAM comprising:
   a plurality of source regions on a plurality of substrate ridges;
   a plurality of isolation trenches positioned between the substrate ridges;
   a plurality of silicon pillars positioned in columns on the substrate ridges between source regions;
   a plurality of word lines that each surround a row of silicon pillars, wherein the word lines are substantially recessed into the isolation trenches to a depth below a top point of the substrate ridges;
   a plurality of digit lines positioned above the silicon pillars;
   a cell capacitor overlying each silicon pillar; and
   an n-doped portion of the substrate extending from the source regions to directly beneath the silicon pillar.

21. A memory array for a DRAM comprising:
   a plurality of source regions on a plurality of substrate ridges;
   a plurality of isolation trenches positioned between the substrate ridges;
   a plurality of silicon pillars positioned in columns on the substrate ridges between source regions;
   a plurality of word lines that each surround a row of silicon pillars, wherein the word lines are substantially recessed into the isolation trenches to a depth below a top point of the substrate ridges;
   a plurality of digit lines positioned above the silicon pillars; and
   a cell capacitor overlying each silicon pillar,
   wherein the cell capacitor comprises:
      a lower electrode contacting a capacitor plug connected to the silicon pillar;
      a capacitor dielectric over the lower electrode: and
      an upper electrode over the lower electrode and the dielectric layer,
   wherein the capacitor dielectric comprises a metal oxide, and
   wherein the metal oxide comprises aluminum oxide.

22. A memory cell comprising
   a vertical transistor including:
      a source region within a ridge of semiconductor material;
      an upper active area on a silicon pillar extending above the ridge; and
      a gate surrounding at least two opposing vertical sides of the silicon pillar, wherein the gate is recessed into a trench next to the ridge;
   a cell capacitor contact plug directly over the silicon pillar; and
   a cell capacitor having:
      a lower electrode over and electrically connected to the cell capacitor contact plug;
      a capacitor dielectric over the lower electrode; and
      an upper electrode over the capacitor dielectric.

23. The memory cell of claim 22, further comprising an extended source region next to the source region.

24. The memory cell of claim 22, wherein the memory cell measures $4F^2$.

* * * * *